(12) United States Patent
Satou et al.

(10) Patent No.: US 7,443,028 B2
(45) Date of Patent: Oct. 28, 2008

(54) IMAGING MODULE AND METHOD FOR FORMING THE SAME

(75) Inventors: Motoaki Satou, Kyoto (JP); Takeshi Kawabata, Osaka (JP); Masatoshi Shinagawa, Shiga (JP); Toshiyuki Fukuda, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 265 days.

(21) Appl. No.: 11/369,818

(22) Filed: Mar. 8, 2006

(65) Prior Publication Data
US 2006/0202318 A1 Sep. 14, 2006

(30) Foreign Application Priority Data
Mar. 9, 2005 (JP) .............................. 2005-065924

(51) Int. Cl.
*H01L 23/48* (2006.01)
(52) U.S. Cl. ................................ 257/734; 257/E23.169
(58) Field of Classification Search ................. 257/734, 257/750, 759
See application file for complete search history.

(56) References Cited

U.S. PATENT DOCUMENTS

| 5,617,131 | A  | * | 4/1997 | Murano et al. | 347/233 |
| 6,266,197 | B1 | * | 7/2001 | Glenn et al. | 359/819 |
| 6,674,159 | B1 | * | 1/2004 | Peterson et al. | 257/680 |
| 6,740,973 | B1 | * | 5/2004 | Hsin | 257/749 |
| 2004/0069998 | A1 | | 4/2004 | Harazono | |
| 2008/0044127 | A1 | * | 2/2008 | Leising et al. | 385/14 |

FOREIGN PATENT DOCUMENTS

| JP | 2002-296435 | | 10/2002 |
| JP | 2002-354200 | A | 12/2002 |
| JP | 2003-218273 | | 7/2003 |

OTHER PUBLICATIONS

Chinese Office Action, with English Translation, issued in corresponding Chinese Patent Application No. 200610054943.8, issued on Jan. 4, 2008.

* cited by examiner

*Primary Examiner*—Wai-Sing Louie
*Assistant Examiner*—Bilkis Jahan
(74) *Attorney, Agent, or Firm*—McDermott Will & Emery LLP

(57) ABSTRACT

An imaging module is formed by stacking: a first resin board; a second resin board having a first opening; a first electrically-conductive member electrically connecting the first resin board and the second resin board to each other; a printed circuit board having a second opening; a second electrically-conductive member electrically connecting the second resin board and the printed circuit board to each other; an imaging semiconductor chip mounted on the lower surface of the second resin board to cover the first opening and provided with an imaging sensor, an optical member placed on the upper surface of the second resin board to cover the first opening; a first semiconductor control chip provided with a control device for controlling operation of the imaging sensor and mounted on the lower surface of the first resin board.

13 Claims, 22 Drawing Sheets

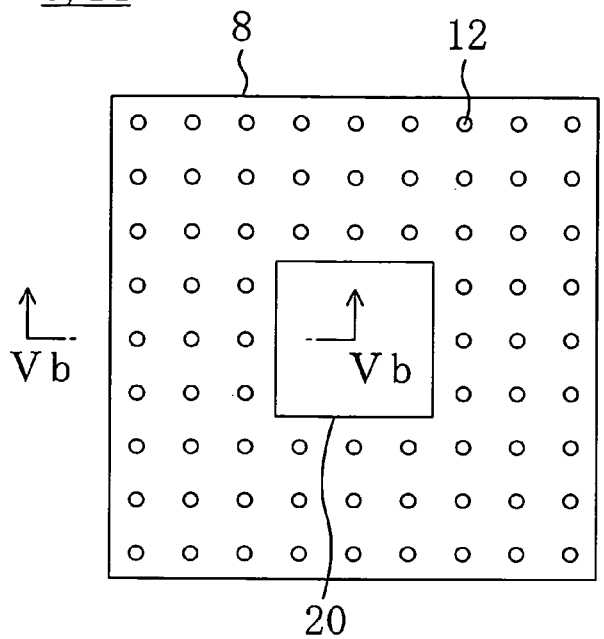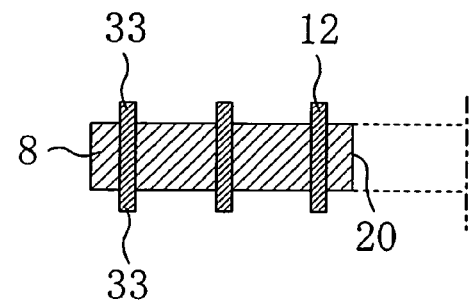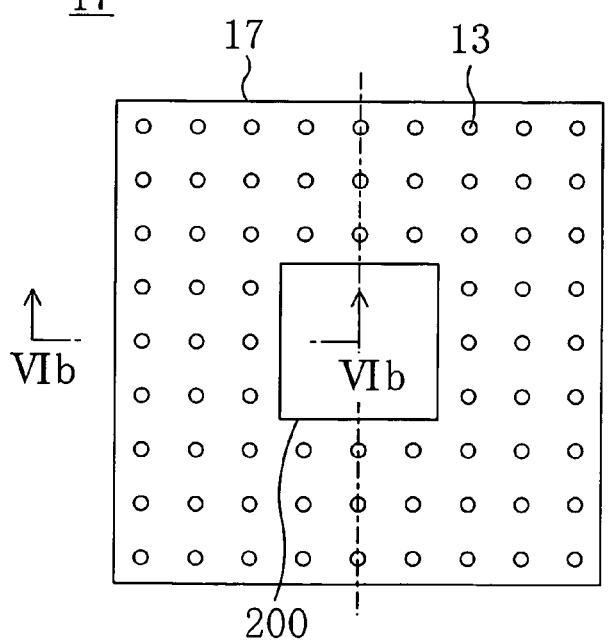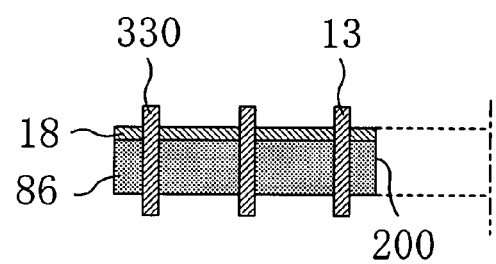

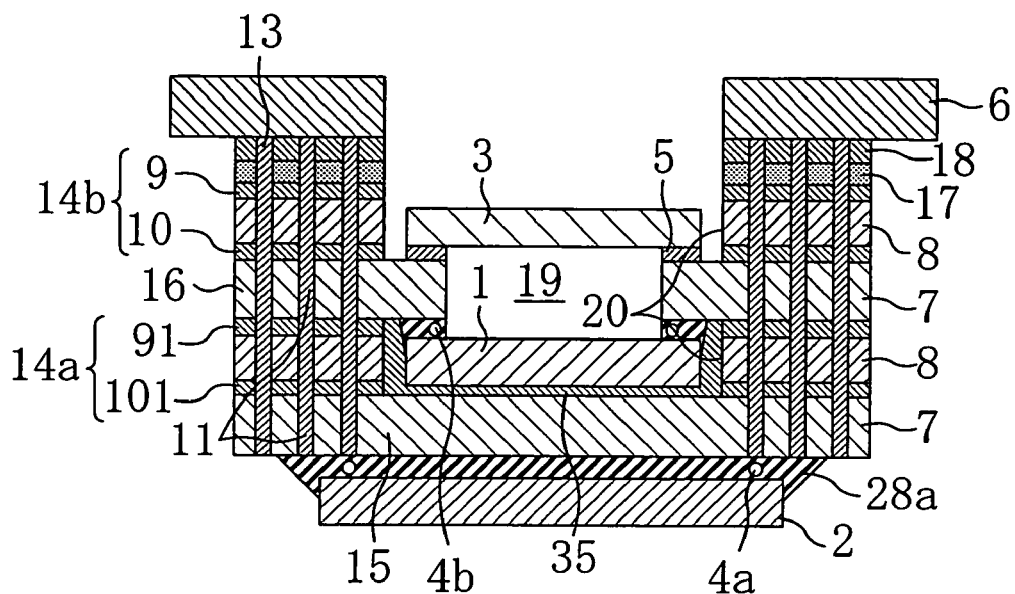
FIG. 14A
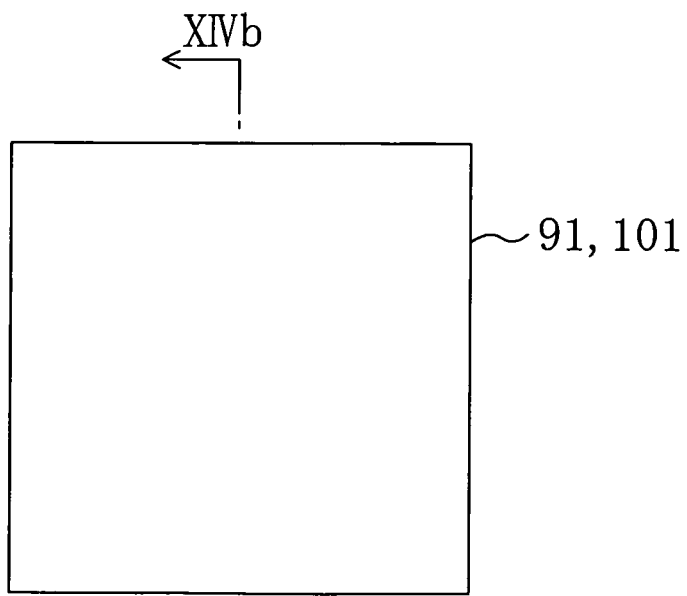
FIG. 14B
FIG. 14C

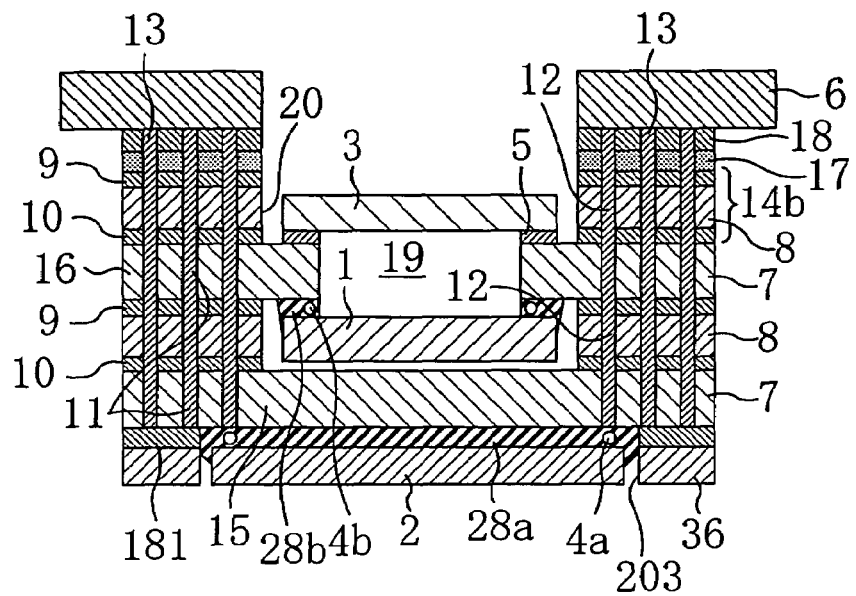
FIG. 19
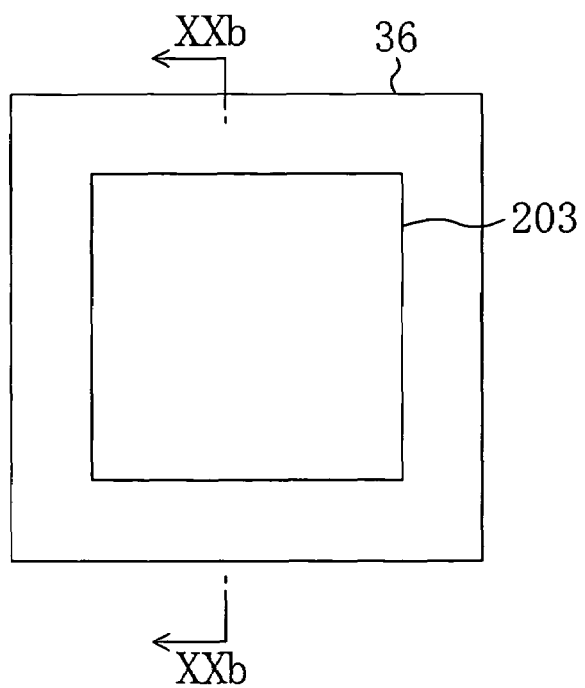
FIG. 20A
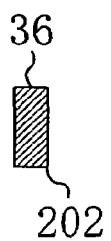
FIG. 20B

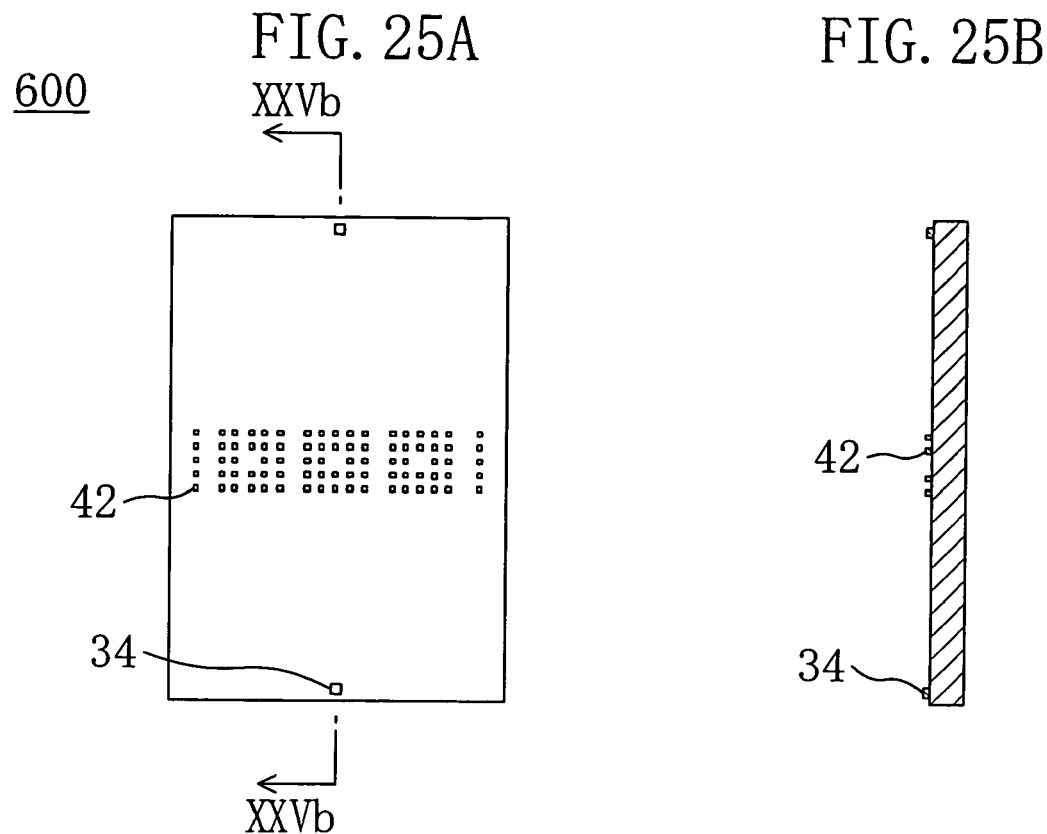
FIG. 25A
FIG. 25B
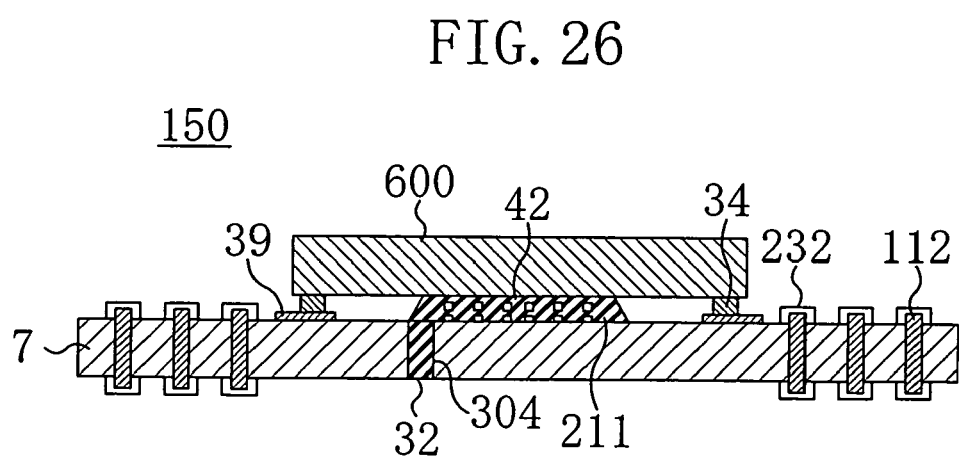
FIG. 26

IMAGING MODULE AND METHOD FOR FORMING THE SAME

BACKGROUND OF THE INVENTION (1) Field of the Invention

The present invention relates to a multilevel imaging module formed by disposing an imaging semiconductor -chip and a semiconductor control chip in three dimensions, and a method for fabricating the module.

(2) Description of Related Art

In recent years, there are a high demand for size reduction and functional improvement of electronic devices such as cellular phones and digital cameras. To meet this demand, multilevel semiconductor packages formed by stacking electronic components, particularly image sensor chips, and integrated circuit chips for signal processing have been proposed.

For example, an imaging module having a stack package structure for electrically connecting an image sensor to a wiring board is known. This imaging module includes, for example, a board, an envelope, an integrated circuit chip, a spacer, an image sensor chip and a transparent layer. In this imaging module, a signal input terminal is provided on the principal surface of the board, and a signal (input) terminal for connection to the wiring board is provided on the back surface of the board. The wiring board is connected to an external circuit. The image sensor chip is placed over the upper surface of the integrated circuit chip with the spacer interposed therebetween, forms a multilayer structure together with the integrated circuit chip, and is electrically connected to the signal input terminal on the board. The transparent layer is made of transparent glass and covers the upper surface of the envelope and the image sensor chip. The principal surface of the board herein is the surface on which semiconductor devices such as an integrated circuit and light receiving/emitting devices are mounted. The back surface of the board herein is the surface opposite to the principal surface.

Now, a conventional example will be further described.

A module disclosed in Japanese Unexamined Patent Publication No. 2002-354200 has a stack structure in which an integrated circuit chip is mounted on a wiring board and an image sensor chip is stacked over the principal surface of the chip with a spacer interposed therebetween. In this structure, an envelope is bonded to the upper surface of the wiring board and transparent glass is attached to the upper surface of the envelope. The wiring board is provided with, on one surface thereof, a connection terminal for connection to a terminal and a metal fine wire on a semiconductor chip. The connection terminal is connected to an external terminal provided on the other surface of the wiring board through a via and a wire. This external terminal is mounted to a mounting board with solder balls interposed therebetween. In this publication, a structure in which semiconductor chips stacked in two levels are placed in a resin-encapsulated hollow package or an OMPAC (Over Molded Pad Array Carrier) package using a resin board is disclosed.

In Japanese Unexamined Patent Publication No. 2002-296435, as an optical device chip included in a package, a chip provided with light receiving/emitting devices is used. Also disclosed is a method for fabricating an optical communication device characterized in that a package is mounted on a printed circuit board with solder ball terminals having a BGA (Ball Grid Array) structure sandwiched therebetween.

SUMMARY OF THE INVENTION

In recent years, a technique for reducing the thickness of a semiconductor wafer by polishing, wet etching or both of these processes and then dicing this wafer into semiconductor chips has been developed. In addition, a technique for mounting such a thin semiconductor chip on a printed circuit board with high yield has also been developed. With these techniques, the number of levels in stacking semiconductor chips or semiconductor chips mounted on printed circuit boards tends to further increase.

However, if a multilevel imaging module is to be implemented by mounting, for example, an imaging semiconductor chip provided with an optical device at the top level, the following drawbacks arise.

First, in a multilevel imaging module, it is difficult to make the optical axis formed by a lens, an optical filter and a cover glass, for example, provided above the imaging semiconductor chip coincide with the vertical axis passing through the center of the principal surface (light-receiving surface) of the imaging semiconductor chip and vertical to the principal surface. With a conventional technique, it is difficult to make the center of an imaging region of the imaging semiconductor chip accurately coincide with the optical axis. In addition, it is also difficult to place a printed circuit board on which an imaging module and other electric devices are mounted in parallel with the imaging semiconductor chip or to enhance the accuracy in disposing the printed circuit board and the imaging semiconductor chip. Because of these drawbacks, the function of the imaging semiconductor chip cannot be fully exhibited in some cases in the conventional multilevel imaging module.

Next, in the multilevel imaging module, mechanical characteristics such as a linear expansion coefficient vary among components and heat is applied to the respective components at different temperatures. Accordingly, deformation and distortion occur after heating and pressurization. The deformation and distortion are particularly conspicuous in a thin imaging module. If the deformation propagates into the imaging semiconductor chip, an imaging pattern becomes distorted with respect to a subject, and the subject cannot be faithfully reproduced in an output image.

On the other hand, to achieve size and thickness reductions of electronic devices, semiconductor chips and imaging modules are often packaged by a BGA process in recent years. With such a packaging process, it is necessary to reduce the heights of solder balls and bump electrodes for connecting a module and a printed circuit board together. Accordingly, if a warp occurs at room temperature or a warp occurs by heating for bonding components together, the imaging module cannot be mounted on the mother board. Even if the imaging module can be mounted on the mother board, partial disconnection occurs, resulting in packaging failures. That is, if a warp occurs, packaging failures make an expensive imaging module unusable even though the imaging module is non-defective.

In techniques disclosed in Japanese Unexamined Patent Publications Nos. 2002-354200 and 2002-296435, no measures are taken to prevent an inclination of optical members with respect to the normal to an imaging surface (principal surface) of an imaging semiconductor chip and a deviation from the center. None of the techniques completely prevents occurrence of a warp of an imaging module.

It is therefore an object of the present invention to provide a multilevel imaging module in which measures are taken to prevent an inclination of optical members with respect to the normal to an imaging surface of an imaging semiconductor chip and deviations between an optical axis formed by the optical members and the imaging surface and occurrence of a warp is suppressed.

An imaging module according to the present invention includes: a first resin board; a second resin board placed on or above the first resin board and having a first opening; a first electrically-conductive member electrically connecting the first resin board and the second resin board to each other; a printed circuit board placed on or above the second resin board and having a light-receiving opening; a second electrically-conductive member electrically connecting the second resin board and the printed circuit board to each other; an imaging semiconductor chip having a principal surface on which an imaging sensor for receiving light from outside the module is provided, the imaging semiconductor chip being mounted on a lower surface of the second board to cover the first opening with the principal surface of the imaging semiconductor chip facing upward; an optical member overlapping the imaging semiconductor chip when viewed from above and placed on an upper surface of the second resin board to cover the first opening, the optical member being smaller than the light-receiving opening when viewed from above; and a semiconductor control chip having a principal surface on which a control device for controlling operation of the imaging sensor is provided.

As described above, in the imaging module of the present invention, an optical member and an imaging chip having its principal surface facing upward (toward the optical member) are mounted on the upper and lower surfaces, respectively, of a second resin board that can be planarized with high accuracy, so that it is possible to prevent an optical axis formed by the optical member from deviating from the normal to the principal surface of the imaging semiconductor chip and light incident through the optical member is received without a loss. Accordingly, if the imaging module of the present invention is applied to a digital camera or a video camera, an image in which a subject is faithfully reproduced is allowed to be output. In addition, since the surface of the resin board has excellent flatness, the imaging semiconductor chip and the printed circuit board are kept in parallel with each other with high accuracy.

In the imaging module of the present invention, a parallel-plane member formed by, for example, a flat resin base and buried conductors may be sandwiched between the second resin board and the printed circuit board. In this case, the imaging semiconductor chip and the printed circuit board are kept in parallel with each other with higher accuracy, so that the positional relationship between the imaging surface (principal surface) of the imaging semiconductor chip and the external equipment is allowed to be maintained as designed.

With the above configuration, a parallel-plane member formed by a base made of a material having a bending strength higher than that of the resin board is also allowed to be sandwiched between the second resin board and the printed circuit board or a rigid plate is allowed to be attached to the lower surface of the first resin board. Accordingly, the amount of a warp of a module caused by heating and pressurization is reduced and deformation is suppressed. As a result, image data in which a subject is faithfully reproduced is output and occurrence of a connection failure between an imaging module and a mother board in the case of adopting a BGA structure is suppressed.

The optical member includes all or at least one of, for example, an optical lens, a shutter mechanism, a diaphragm, an optical filter and a cover glass. In particular, in the case of an optical lens, the thickness of the optical member is allowed to be larger than that of a conventional optical member, so that a material having a low refractive index can be used to reduce fabrication cost and occurrence of a warp is suppressed.

A method for fabricating an imaging module according to the present invention is a method for forming an imaging module formed by stacking a first resin board, a second resin board having a first opening, a printed circuit board having a second opening, an imaging semiconductor chip having a principal surface on which an imaging sensor for receiving light from outside the module is provided and larger than the first opening when viewed from above, an optical member larger than the first opening and smaller than the second opening when viewed from above, and a semiconductor control chip having a principal surface on which a control device for controlling operation of the imaging sensor is provided. The method includes the steps of: (a) stacking, in this order, the first resin board having a lower surface on which the semiconductor control chip is mounted, the second resin board having a lower surface on which the imaging semiconductor chip covering the first opening is mounted with the principal surface of the imaging semiconductor chip facing upward, and the printed circuit board; (b) performing a heating process with a pressure applied between the first resin board and the printed circuit board, thereby uniting the first resin board, the second resin board and the printed circuit board to form a stacked structure, after the step (a); and (c) placing the optical member on an upper surface of the second resin board such that the optical member covers the first opening with the second opening interposed therebetween.

With this method, a highly-reliable imaging module is easily fabricated. In addition, the optical member is easily mounted through an opening formed in the printed circuit board. Moreover, after resin boards, chips, a printed circuit board and a thin optical member have been united, an additional optical member is additionally mounted. Accordingly, it is possible to prevent a plastic member, which is formed at a relatively low cost, in the optical member from being deformed by heat and pressure.

BRIEF DESCRIPTION OF THE DRAWINGS

FIG. 5A is a plan view illustrating a sheet member of the imaging module of the third embodiment. FIG. 5B is a view illustrating a cross section of the sheet member taken along the line Vb-Vb in FIG. 5A.

FIG. 6A is a plan view schematically illustrating the shape of a parallel-plane member of the imaging module of the third embodiment. FIG. 6B is a view illustrating a cross section of the imaging module taken along the line VIb-VIb in FIG. 6A.

FIG. 14A is a cross-sectional view illustrating a configuration of an imaging module according to a fourth embodiment. FIG. 14B is a plan view illustrating an adhesive member used in the imaging module. FIG. 14C is a view showing a cross section of the adhesive member taken along the line XIV-XIV in FIG. 14B.

FIG. 19 is a cross-sectional view illustrating an imaging module of a sixth embodiment of the present invention.

FIG. 20A is a plan view showing an example of a rigid plate in the imaging module of the sixth embodiment. FIG. 20B is a view showing a cross section taken along the line XXb-XXb in FIG. 20A.

FIG. 25A is a plan view illustrating a semiconductor control chip mounted on a first resin board used in the imaging module of the eighth embodiment. FIG. 25B is a cross-sectional view of the semiconductor control chip taken along the line XXVb-XXVb in FIG. 25A.

FIG. 26 is a cross-sectional view showing a configuration in which the semiconductor control chip shown in FIG. 25 is mounted on the first resin board shown in FIGS. 24A and 24B.

DETAILED DESCRIPTION OF THE INVENTION

EMBODIMENT 1

An imaging module 560 according to a first embodiment of the present invention will be described with reference to FIG. 1A.

Figure 1A:
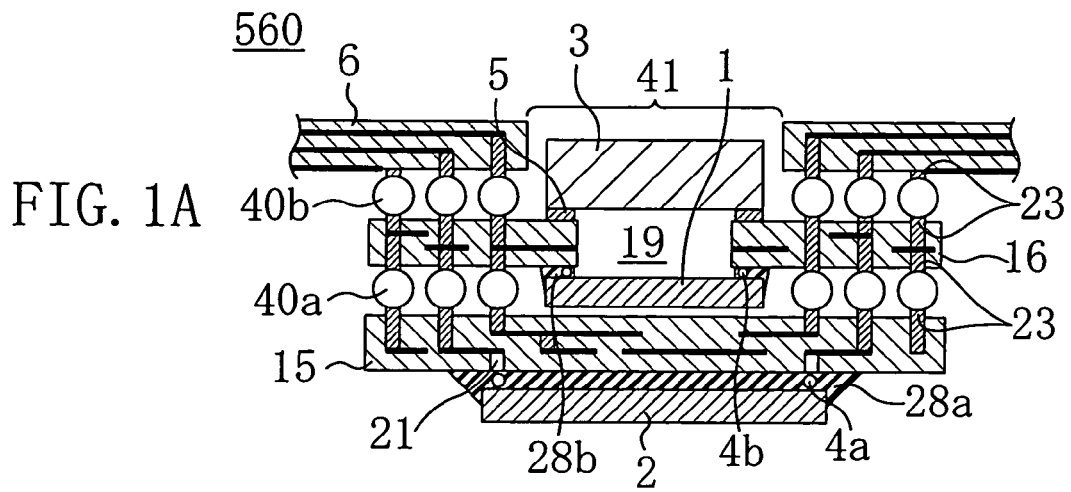
FIG. 1A is a cross-sectional view illustrating an overall configuration of the imaging module according to a first embodiment of the present invention.

FIG. 1A is a cross-sectional view (cross-sectional end view) illustrating an overall configuration of the imaging module 560 of this embodiment. As illustrated in FIG. 1A, the imaging module 560 of this embodiment includes: a first resin board 15; a semiconductor control chip 2 partly sealed with a sealing resin 28a at the lower surface of the first resin board 15; a second resin board 16 having an imaging opening 19 at its center region and provided over the first resin board 15 with electrically-conductive members 40a sandwiched therebetween; an imaging semiconductor chip 1 placed on the lower surface of the second resin board 16; a printed circuit board 6 having a light-receiving opening 41 and placed over the second resin board 16 with the electrically-conductive members 40b sandwiched therebetween; and an optical member 3 placed on the upper surface of the second resin board 16 and housed in the light-receiving opening 41. The first resin board 15 is located at the bottom of the stacked resin boards. The imaging module 560 of this embodiment is made of resin boards and chips integrated by performing heating and pressurization on the first resin board 15, the second resin board 16, the printed circuit board 6 and other components stacked in the manner described above.

Control devices for controlling imaging devices such as a light-receiving device and a light-emitting device on the imaging semiconductor chip 1 and electrode bumps 4a connected to, for example, the control devices are provided on the principal surface of the semiconductor control chip 2. The semiconductor control chip 2 is placed to have its principal surface face the lower surface of the first resin board 15.

Connecting lands 23 are formed on a region (peripheral region) of the upper surface of the first resin board 15 surrounding a region overlapping the imaging semiconductor chip 1 when viewed from above. Connection terminals 21 in contact with the electrode bumps 4a are formed on a region of the lower surface of the first resin board 15 where the semiconductor control chip 2 is to be mounted. These connection terminals 21 are electrically connected to the connection lands 23 provided on the lower surface of the first resin board 15 through wires. Connection lands 23 are also formed on the upper and lower surfaces of the second resin board 16 and the lower surface of the printed circuit board 6.

The imaging semiconductor chip 1 is placed such that the principal surface thereof faces the lower surface of the second resin board 16 and a center portion (of the imaging semiconductor chip) overlaps a center portion of the imaging opening 19. The imaging opening 19 in this embodiment is smaller than the imaging semiconductor chip 1 and the optical member 3 when viewed from above. With this configuration, light entering from outside the module through the optical member 3 housed in the light-receiving opening 41 and the imaging opening 19 is received at an imaging surface of the imaging semiconductor chip 1. If the imaging semiconductor chip 1 is provided with a light-emitting device, light output from the light-emitting device through the optical member 3 and the imaging opening 19 are emitted to the outside of the module.

The electrode bumps 4b formed on the principal surface of the imaging semiconductor chip 1 are connected to the connection terminals 21 formed on the lower surface of the second resin board 16. A portion where electrode bumps 4b and the connection terminals 21 are connected to each other is sealed with sealing resin 28b. To prevent stress from being applied to the imaging semiconductor chip 1 from the first resin board 15, a gap is formed between the back surface of the imaging semiconductor chip 1 and the upper surface of the first resin board 15. It should be noted that, as described in a subsequent embodiment, the back surface of the imaging semiconductor chip 1 may be covered with a sheet member having an adhesive layer. The sealing resin 28b protects the imaging surface of the imaging semiconductor chip 1 against external environment and absorbs, for example, thermal distortion occurring between the imaging semiconductor chip 1 and the second resin board 16.

The optical member 3 is made of cover glass or transparent resin, for example, and adheres to the imaging semiconductor chip 1 with an optical-member adhesive 5 such that the optical member 3 overlaps the imaging semiconductor chip 1 when viewed from above.

In the imaging module 560 of this embodiment, control devices formed on the semiconductor control chip 2 are connected to devices on the imaging semiconductor chip 1 through the electrode bumps 4a and 4b, the connection terminals 21, wires, the connection lands 23 and the electrically-conductive members 40a. Part of the control devices formed on the semiconductor control chip 2 and the devices on the imaging semiconductor chip 1 are connected to external equipment through the connection lands 23 formed on the back surface of the printed circuit board 6, for example.

The imaging module 560 of this embodiment is characterized in that the optical member 3 is mounted on the upper surface of one resin board (i.e., the second resin board 16) and the imaging semiconductor chip 1 is mounted on the lower surface of the same resin board. The upper surface and the lower surface of the second resin board 16 are planarized with high precision. Accordingly, it is possible to accurately dispose the optical member 3 and the imaging semiconductor chip 1 at desired positions, thus suppressing an inclination of the optical axis formed by the optical member 3 with respect to the normal to the imaging surface (principal surface) of the imaging semiconductor chip 1. In the foregoing configuration, the printed circuit board 6 and the imaging semiconductor chip 1 are disposed in parallel with each other with high accuracy, so that the positional relationship between the imaging surface of the imaging semiconductor chip 1 and the external equipment is accurately maintained as designed. Accordingly, if the imaging module of this embodiment is used for an imaging device such as a digital camera or a videocassette recorder, it is possible to output an image in which a subject is faithfully reproduced. In this case, imaging devices provided in the imaging semiconductor chip 1 are, for example, an image sensor, and the optical member 3 may include a mechanical part driven by a motor, e.g., a shutter mechanism, a diaphragm or an auto-focus, in addition to an optical lens, an optical filter and a cover glass, for example. This eases wiring such as lead wiring or socket wiring from external equipment to the optical member 3 by way of the printed circuit board 6, thus making it possible to reduce the numbers of optical lenses and mechanism elements externally equipped to the printed circuit board.

In the imaging module 560 of this embodiment, the light-receiving opening 41 is formed in the printed circuit board 6, so that incident light from outside the module reaches the principal surface of the imaging semiconductor chip 1 and the optical member 3 is allowed to be thick to exceed the upper surface of the printed circuit board 6. Accordingly, the rigidity of the entire imaging module is increased so that occurrence of a warp is suppressed. In addition, as compared to a conventional imaging module including a thin optical member, the optical member 3 can be made of a material having a low refractive index, so that the module of this embodiment is fabricated at a cost lower than that in the case of using a high refractive-index material. In addition, the total thickness of the optical member 3 is larger than that in a conventional module, so that the optical member 3 is allowed to have a plurality of (e.g., three) lenses. In this case, if three lenses having different focal lengths and different magnifications and each having its focus on the imaging semiconductor chip 1 are provided, a smooth high-quality image is obtained in a digital zoom from low magnification to high magnification. In addition, a combination of a plurality of lenses suppresses the influence of variations in refractive index among wavelengths of light on the lenses, so that it is possible to reproduce colors correctly.

In the imaging module of this embodiment, the imaging opening 19 is formed in a center region of the second resin board 16 as an example. Alternatively, the imaging opening 19 may be formed in a region of the second resin board 16 other than the center region thereof as long as the optical axis formed by the optical member 3 is perpendicular to the imaging surface of the imaging semiconductor chip 1.

In the imaging module 560 of this embodiment, a resin board on which another semiconductor chip is mounted may be further provided between the first resin board 15 and the second resin board 16. The imaging semiconductor chip 1 is not necessarily stacked together with the semiconductor control chip 2, and may be stacked together with another semiconductor chip.

EMBODIMENT 2

An imaging module 570 according to a second embodiment of the present invention will be described with reference to FIG. 1B. In this embodiment, aspects different from the first embodiment will be mainly described.

Figure 1B:
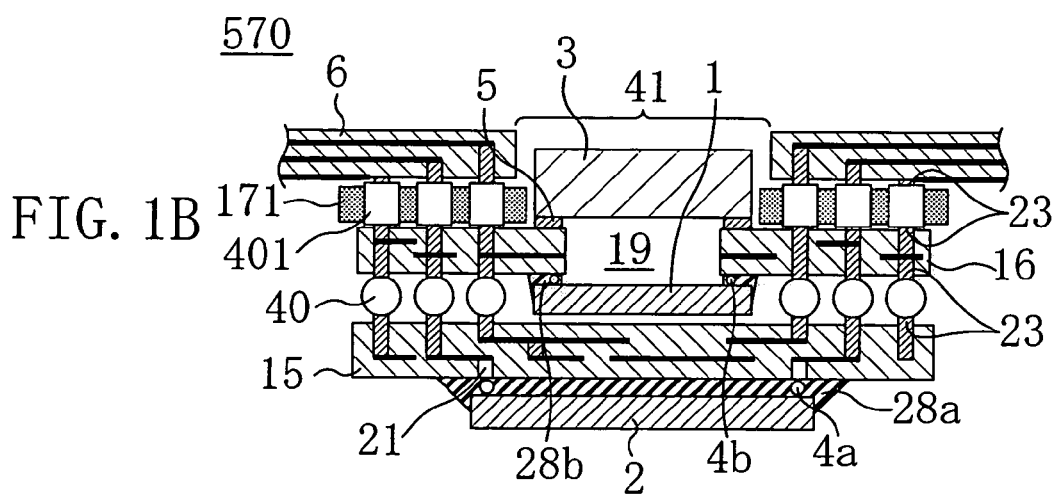
FIG. 1B is a cross-sectional view illustrating a configuration of an imaging module according to a second embodiment of the present invention.

FIG. 1B is a cross-sectional view illustrating an overall configuration of the imaging module 570 of this embodiment. As illustrated in FIG. 1B, the imaging module 570 of this embodiment includes: a first resin board 15; a semiconductor control chip 2 partly sealed with a sealing resin 28a at the lower surface of the first resin board 15; a second resin board 16 having an imaging opening 19 at its center region and placed over 10 the first resin board 15 with first electrically-conductive members 40 sandwiched therebetween; an imaging semiconductor chip 1 placed on the lower surface of the second resin board 16; a printed circuit board 6 having a light-receiving opening 41 and placed above the second resin board 16; a parallel-plane member 171 sandwiched between the second resin board 16 and the printed circuit board 6 and having an opening at its center; and an optical member 3 placed on the upper surface of the second resin board 16 and housed in the light-receiving opening 41 and the opening of the parallel-plane member 171. The first resin board 15 is located at the bottom of the stacked resin boards. The imaging module 570 of this embodiment is made of resin boards and chips integrated by performing heating pressurization on the first resin board 15, the second resin board 16 and the printed circuit board 6, for example, stacked in the manner described above.

One or more second electrically-conductive members 401 are buried in the parallel-plane member 171. The second electrically-conductive members 401 electrically connect connection lands 23 provided on the upper surface of the second resin board 16 to connection lands 23 provided on the back surface of the printed circuit board 6.

The imaging module 570 of this embodiment is made of resin boards and chips integrated by performing heating and pressurization on the first resin board 15, the second resin board 16, the parallel-plane member 171 and the printed circuit board 6, for example, stacked in the manner described above. That is, in the imaging module 570 of this embodiment, the electrically-conductive members 40b of the imaging module 560 of the first embodiment are replaced by the parallel-plane member 171.

The parallel-plane member 171 includes a resin base made of a resin such as polyimide or epoxy resin and having a uniform thickness. On each of the upper and lower surfaces of the resin base, an adhesive layer (not shown) which is softened to be adhesive by heating may be provided.

Part of control devices provided on the semiconductor control chip 2 is connected to, for example, external equipment through electrode bumps 4a, wires (not shown), first electrically-conductive members 40, the connection lands 23 provided on the resin boards, the second electrically-conductive members 401 and the connection lands 23 provided on the printed circuit board 6, for example. Part of imaging devices provided on the imaging semiconductor chip 1 is connected to external equipment through electrode bumps 4b, the connection lands 23 provided on the second resin board 16, the second electrically-conductive members 401 and the connection lands 23 provided on the printed circuit board 6, for example.

Since the resin base forming the parallel-plane member 171 has excellent flatness, a misalignment between the printed circuit board 6 and the second resin board 16 is suppressed after heating and pressurization. Accordingly, in the imaging module 570 of this embodiment, the printed circuit board 6 and the imaging semiconductor chip 1 are disposed in parallel with each other more accurately than in the imaging module 560 of the first embodiment. This allows the positional relationship between an imaging surface of the imaging semiconductor chip 1 and external equipment to be accurately maintained as designed. As a result, if the imaging module 570 of this embodiment is used for an imaging device such as a digital camera and a videocassette recorder, it is possible to output an image in which a subject is faithfully reproduced.

EMBODIMENT 3

Figure 1C:
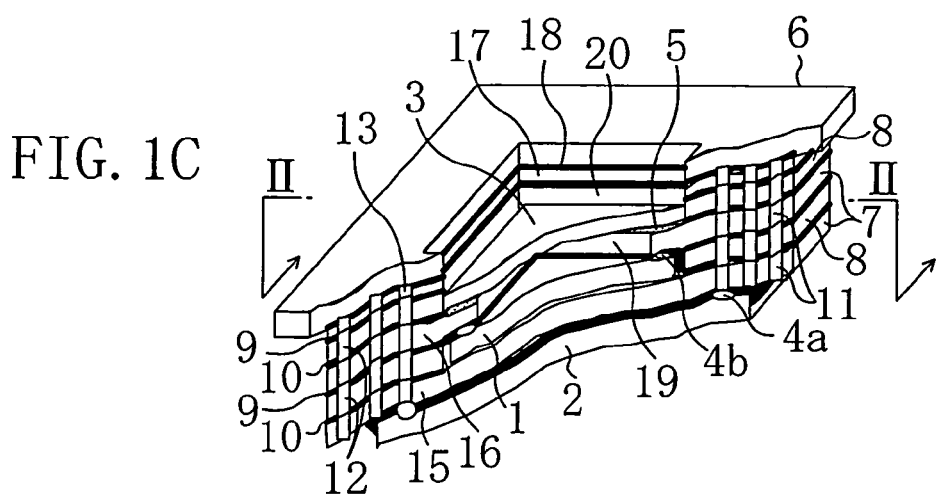
FIG. 1C is a perspective cross-sectional view schematically illustrating a configuration of an imaging module according to a third embodiment of the present invention.
Figure 2:
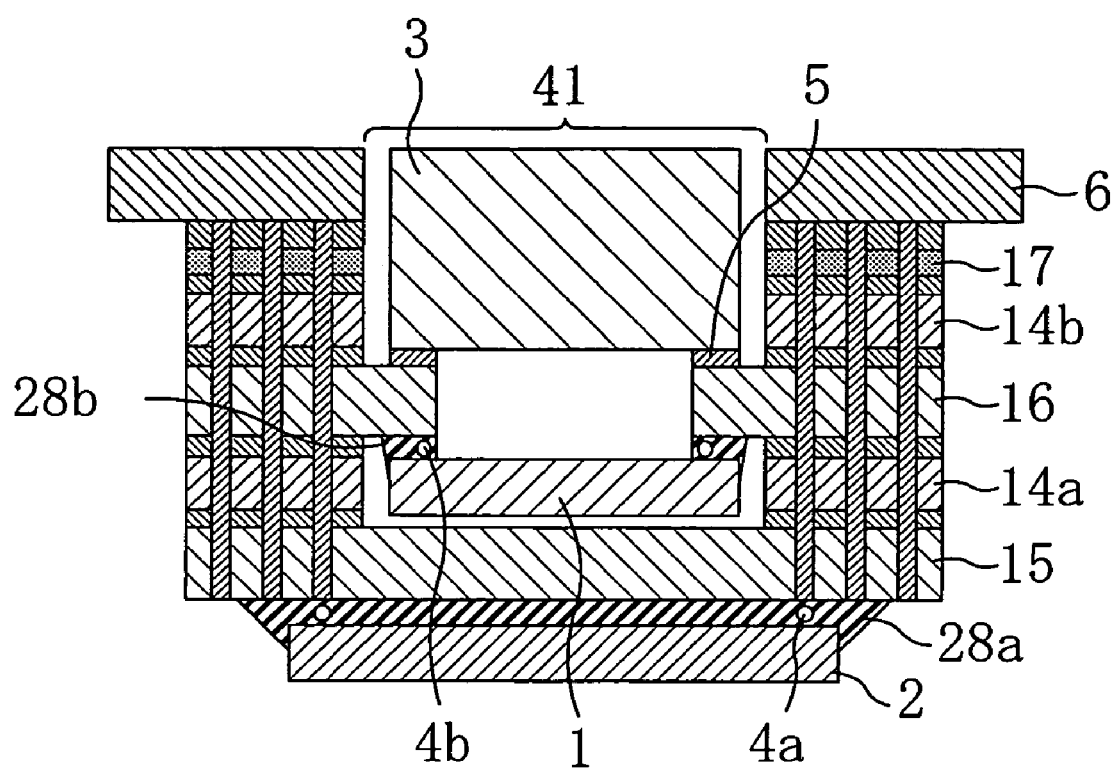
FIG. 2 is cross-sectional view of the imaging module of the third embodiment taken along the line II-II in FIG. 1C.

FIG. 1C is a perspective cross-sectional view schematically illustrating an overall configuration of an imaging module 500 according to a third embodiment of the present invention. FIG. 2 is a cross-sectional view of the imaging module 500 taken along the line II-II in FIG. 1C. FIGS. 3A through 3C, FIGS. 4A through 4C, FIGS. 5A and 5B, FIGS. 6A and 6B and FIGS. 7A and 7B are views illustrating components of the imaging module 500 of this embodiment. Hereinafter, the imaging module of this embodiment will be described with reference to the drawings.

—Configuration of Imaging Module—

As illustrated in FIG. 1C and FIG. 2, the imaging module 500 of this embodiment includes: a first resin board 15; a semiconductor control chip 2 partly sealed with a sealing resin 28a at the lower surface of the first resin board 15; a first sheet member 14a having an opening at its center region and adhering to the upper surface of the first resin board 15; a second resin board 16 having an imaging opening 19 at its center region and adhering to the first sheet member 14a; an imaging semiconductor chip 1 placed on the lower surface of the second resin board 16 and housed in the opening of the first sheet member 14a; a second sheet member 14b having a light-receiving opening at its center region and adhering to the upper surface of the second resin board 16; a parallel-plane member 17 having a light-receiving opening at its center region and adhering to the upper surface of the second sheet member 14b; a printed circuit board 6 having a light-receiving opening 41 and adhering to the parallel-plane member 17; and an optical member 3 placed on the upper surface of the second resin board 16 and housed in the openings of the second sheet member 14b and the parallel-plane member 17 and in the light-receiving opening 41. The imaging module 500 of this embodiment is made of resin boards and chips integrated by performing heating and pressurization on, for example, the first resin board 15, the first sheet member 14a, the second resin board 16, the second sheet member 14b and the printed circuit board 6 stacked in the manner described above.

In this embodiment, the first resin board 15 and the first sheet member 14a are bonded together and the second resin board 16 and the second sheet member 14b are bonded together, using second adhesive members 10. The first sheet member 14a and the second resin board 16 are bonded together and the second sheet member 14b and the parallel-plane member 17 are bonded together, using first adhesive members 9 which are respective parts of the first sheet member 14a and the second sheet member 14b, respectively.

As in the imaging modules of the first and second embodiments, control devices for controlling imaging semiconductor devices such as a light-receiving device and a light-emitting device formed on the imaging semiconductor chip 1 and electrode bumps 4a connected to, for example, the control devices are provided on the principal surface of the semiconductor control chip 2. The semiconductor control chip 2 is placed to have its principal surface face the lower surface of the first resin board 15.

Figure 3A:
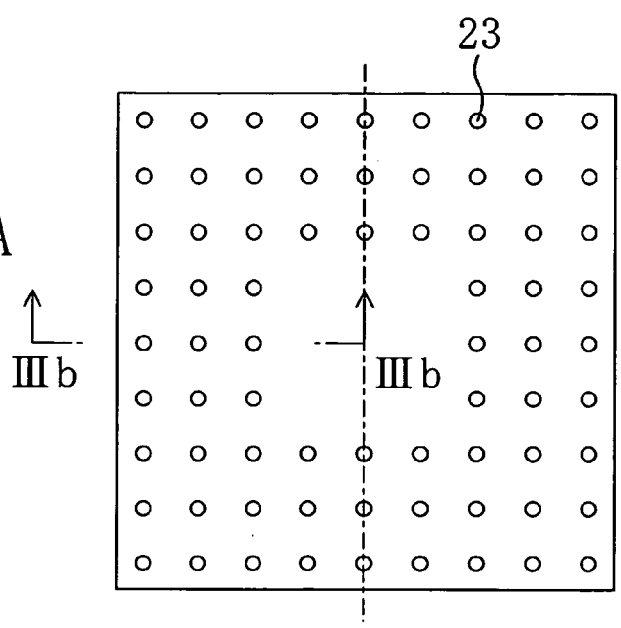
FIG. 3A is a plan view schematically illustrating the upper surface of a first resin board of the imaging module of the third embodiment.
Figure 3B:
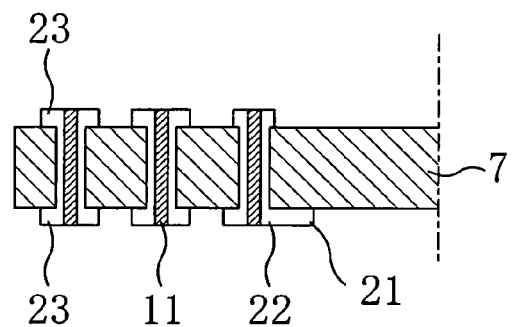
FIG. 3B is a view illustrating a cross section of the first resin board taken along the line IIIb-IIIb in FIG. 3A.
Figure 3C:
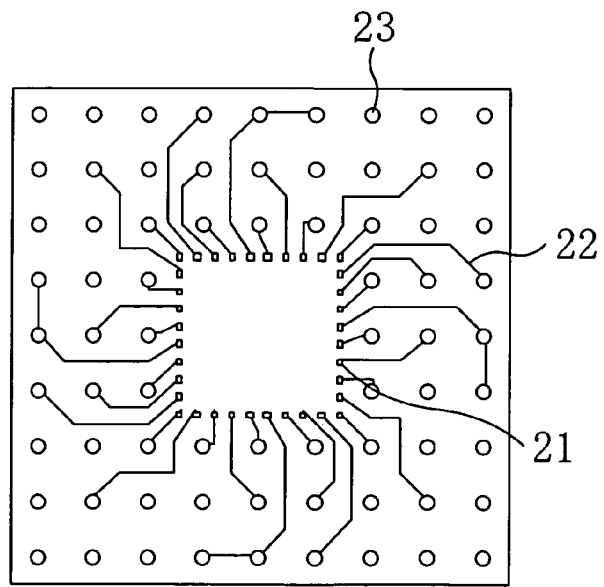
FIG. 3C is a plan view schematically illustrating the back surface of the first resin board.

FIG. 3A is a plan view schematically showing the upper surface of the first resin board 15 in the imaging module of this embodiment. FIG. 3B is a view illustrating a cross section of the first resin board 15 taken along the line IIIb-IIIb in FIG. 3A. FIG. 3C is a plan view schematically illustrating the lower surface of the first resin board 15. The arrangement and size of first buried conductors 11 in these figures are schematically illustrated for simplicity and can be different from those in an actual imaging module. Likewise, components are also schematically illustrated in plan views other than FIGS. 3A and 3C.

As illustrated in FIGS. 1A through 1C, FIG. 2 and FIGS. 3A through 3C, connection lands 23 (see FIGS. 3A through 3C) are formed on a region (peripheral region) of the upper surface of the first resin board 15 surrounding a region overlapping the imaging semiconductor chip 1 when viewed from above. Connection terminals 21 in contact with the electrode bumps 4a are formed on a region of the lower surface of the first resin board 15 on which the semiconductor control chip 2 is to be mounted. In the first resin board 15, the connection lands 23 provided on the upper surface are electrically connected to connection lands 23 on the lower surface through the first buried conductors 11 penetrating through a first resin base 7. The connection lands 23 provided on the lower surface of the first resin board 15 are electrically connected to connection terminals 21 with wires 22. The first buried conductors 11 are preferably made of a conductive resin material or a plating conductor, for example.

Connection lands 230 (see FIG. 4A through 4C) are also formed on the upper and lower surfaces of the second resin board 16 and the lower surface of the printed circuit board 6.

The imaging semiconductor chip 1 is placed to have its principal surface face the lower surface of the second resin board 16 and have a center portion (of the chip) overlap a center portion of the imaging opening 19. In this embodiment, the imaging opening 19 is smaller than those of the imaging semiconductor chip 1 and the optical member 3 when viewed from above. This configuration allows light incident from outside the module to be received at the imaging surface of the imaging semiconductor chip 1 through the optical member 3 hosed in the light-receiving opening 41 and the imaging opening 19. If the imaging semiconductor chip 1 is provided with a light-emitting device, light output from the light-emitting device through the optical member 3 and the imaging opening 19 is allowed to be emitted toward outside the module.

The electrode bumps 4b formed on the principal surface of the imaging semiconductor chip 1 are connected to the connection lands 23. A portion where the electrode bumps 4b and the connection terminals 21 are connected to each other is sealed with a sealing resin 28b. To prevent stress from being applied from the first resin board 15 to the imaging semiconductor chip 1, a gap is formed between the back surface of the imaging semiconductor chip 1 and the upper surface of the first resin board 15.

The optical member 3 includes a cover glass and a transparent resin, for example, and adheres to the second resin board 16 with an optical-member adhesive 5 to overlap the imaging semiconductor chip 1 when viewed from above. The optical member 3 may include a lens, an optical filter, an auto-focus and a diaphragm, for example.

Figure 4A:
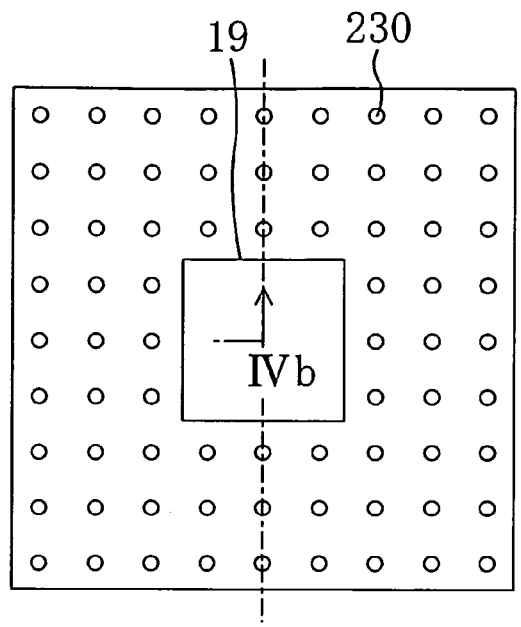
FIG. 4A is a plan view schematically illustrating the upper surface of a second resin board of the imaging module of the third embodiment.
Figure 4B:
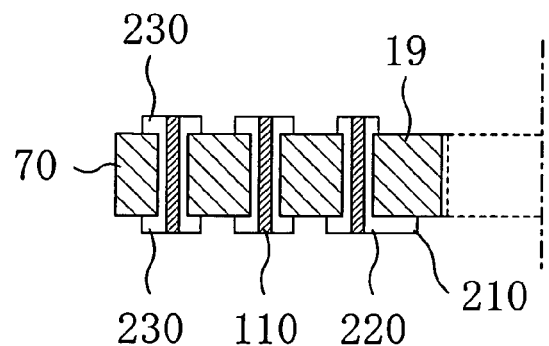
FIG. 4B is a view illustrating a cross section of the second resin board taken along the line IVb-IVb in FIG. 4A.
Figure 4C:
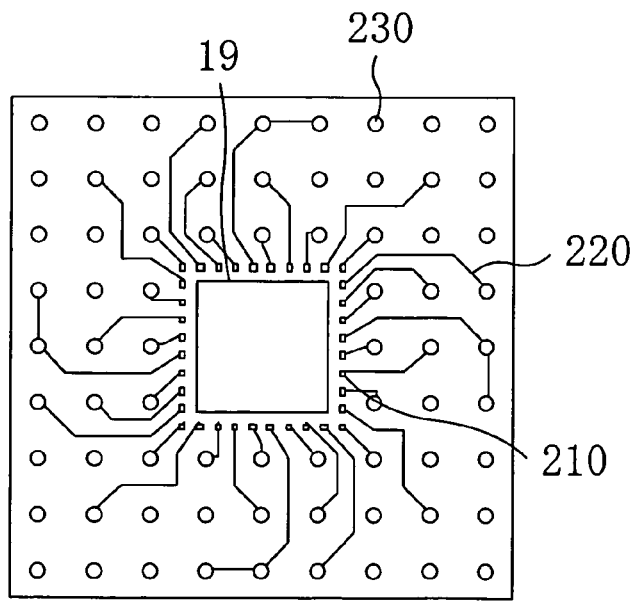
FIG. 4C is a plan view schematically illustrating the back surface of the second resin board.

FIG. 4A is a plan view schematically illustrating the upper surface of the second resin board 16 in the imaging module of this embodiment. FIG. 4B is a view illustrating a cross section of the second resin board 16 taken along the line IVb-IVb in FIG. 4A. FIG. 4C is a plan view schematically illustrating the lower surface of the second resin board 16.

As illustrated in FIGS. 4A through 4C, a large number of connection lands 230 are formed on the upper surface and the lower surface of the second resin board 16. On the lower surface of the second resin board 16, connection terminals 210 connected to the electrode bumps 4b of the imaging semiconductor chip 1, the connection lands 230 and wires 220 connecting the connection lands 230 and the connection terminals 210 together are provided. The second resin board 16 includes a first resin base 70 and first buried conductors 110 connecting the connection lands 230 on the upper surface to the connection lands 230 on the lower surface. The first buried conductors 110 are preferably made of a conductive resin material or a plating conductor.

FIG. 5A is a plan view schematically illustrating the first sheet member 14a and the second sheet member 14b. FIG. 5B is a view illustrating a cross section of the sheet members taken along the line Vb-Vb in FIG. 4A. The first sheet member 14a and the second sheet member 14b have the same structure, and thus these sheet members will be collectively referred to as "sheet members 14". Each of the sheet members 14 includes: a second resin base 8 having an opening 20; and a large number of second buried conductors 12 penetrating through the second resin base 8. The both ends of each of the second buried conductors 12 project from the upper surface and the lower surface, respectively, of the second resin base 8 (to form projections 33). The second buried conductors 12 in a semi-cured state are mounted on the resin boards and are compressed and cured through pressurization and heating. During the compression and curing, the projections 33 allow the second buried conductors 12 to be brought into mechanical contact with the connection lands 23 on the first resin board 15 and the connection lands 230 on the second resin board 16. In this manner, the second buried conductors 12 are electrically connected to the connection lands 23 and the connection lands 230.

In addition, in the imaging module of this embodiment, the second resin base 8 is preferably thicker than the imaging semiconductor chip 1. With this configuration, even if the first adhesive members 9 and the second adhesive members 10 are softened by heating to have their thicknesses reduced by pressure during heating and pressurization, deformation of the adhesive members is suppressed because of the thickness of the second resin base 8. As a result, no pressure is applied to the imaging semiconductor chip 1, so that occurrence of a crack or a warp during fabrication is prevented. The second resin base 8 may be thicker than that described in this embodiment. Then, a warp occurring in the imaging module 500 is further suppressed. A specific example of thickness of the second resin base will be described later.

FIG. 6A is a plan view schematically illustrating a structure of the parallel-plane member 17 in the imaging module 500 of this embodiment. FIG. 6B is a view illustrating a cross section of the imaging module 500 taken along the line VIb-VIb in FIG. 6A.

As illustrated in FIGS. 6A and 6B, an opening 200 is formed in a center region of the parallel-plane member 17, and the parallel-plane member 17 includes: a thin-plate third resin base 86; an adhesive layer 18 provided on one surface (the upper surface in FIG. 6B) of the third resin base 86; and third buried conductors 13 penetrating through the third resin base 86 and the adhesive layer 18.

The adhesive layer 18 is softened by heating to be adhesive and bond the third resin base 86 and the printed circuit board 6 together in the imaging module 500. The third resin base 86 exhibits a small variation in in-plane thickness and has a uniform thickness. When viewed from above, the size and the position of the opening 200 are the same as those of the opening 20 formed in the second sheet member 14b located under the parallel-plane member 17. In a portion of the parallel-plane member 17 about the periphery of the opening 200, the third buried conductors 13 are formed at positions corresponding to the second buried conductors 12 formed in the second resin base 8 when viewed from above.

One end of each of the third buried conductors 13 projects from the upper surface of the third resin base 86 (to form a projection 330). These projections 330 are brought into mechanical contact with connection lands 231 on the printed circuit board 6 with the parallel-plane member 17 stacked together with the second sheet member 14b and the printed circuit board 6, to obtain electrical connection in the imaging module. With this configuration, the imaging surface of the imaging semiconductor chip 1 and the upper surface of the printed circuit board 6 are kept in parallel with each other with high accuracy.

Figure 7A:
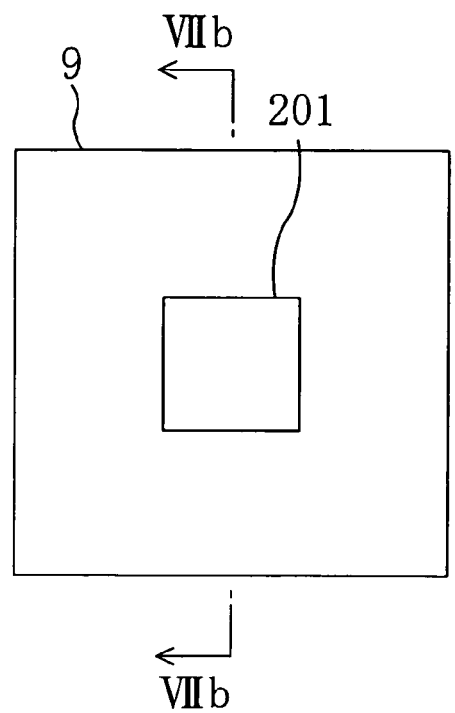
FIG. 7A is a plan view illustrating a first adhesive member and a second adhesive member of the imaging module of the third embodiment.
Figure 7B:
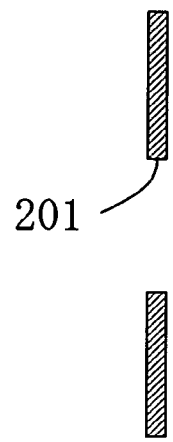
FIG. 7B is a view illustrating a cross section of the first adhesive member and the second adhesive member taken along the line VIIb-VIIb in FIG. 7A.

FIG. 7A is a plan view illustrating the first adhesive members 9 and the second adhesive members 10 in the imaging module of this embodiment. FIG. 7B is a view illustrating a cross section of the first adhesive members 9 and the second adhesive members 10 taken along the line VIIb-VIIb in FIG. 7A. The first adhesive members 9 and the second adhesive members 10 have the same configuration, and thus the structure is shown using one of the first adhesive members 9 as an example.

The first adhesive member 9 and the second adhesive member 10 provided on the upper surface and the lower surface, respectively, of the sheet member 14 have openings 201 having the same size at the same position as the opening 20 in the second resin base 8 of the sheet member 14 and are made of a material which is softened by heating to be adhesive. With this structure, the first adhesive members 9 and the second adhesive members 10 ensure bonding to components adjacent to the sheet members 14 such as the first resin board 15, the second resin board 16, the parallel-plane member 17 and the second resin base 8. In addition, the projections of the buried conductors in the components are allowed to easily penetrate through the adhesive members softened by heating, so that excellent electrical connection to the connection lands provided on the respective components is achieved.

As described above, in the imaging module of this embodiment, the optical member 3 is provided on the upper surface of the second resin board 16 and the imaging semiconductor chip 1 is mounted on the lower surface of the second resin board 16, so that positional deviation of the optical member 3 from the imaging semiconductor chip 1 is suppressed. In addition, the sheet members 14 including buried conductors are provided between the first resin board 15 and the second resin board 16 and between the second resin board 16 and the parallel-plane member 17, so that the second resin board 16 and the printed circuit board 6 are kept in parallel with each other more accurately than in the case of using electrically-conductive members such as metal balls. Accordingly, in the imaging module of this embodiment, the printed circuit board 6 and the imaging semiconductor chip 1 are kept in parallel with each other with high accuracy. The parallel-plane member 17 enhances the accuracy in disposing the printed circuit board 6 and the imaging semiconductor chip 1 in parallel with each other. Accordingly, a positional relationship between the imaging surface of the imaging semiconductor chip 1 and external equipment is also kept with high accuracy as designed.

Since the first sheet member 14a (or the second resin base 8) is thicker than the imaging semiconductor chip, no pressure is applied to the imaging semiconductor chip 1 during pressurization and heating, thus preventing occurrence of a crack and a warp. Accordingly, if the imaging module of this embodiment is applied to an imaging device such as a digital camera or a videocassette recorder, it is possible to output an image in which a subject is faithfully reproduced.

After the components are stacked and bonded together, the optical member 3 (e.g., a cover glass or a transparent resin) is fixed and bonded to the upper surface of the second resin board 16 with the optical-member adhesive 5 to cover the imaging opening 19. In this manner, the imaging module 500 of this embodiment is implemented.

For the first resin base 7 forming each of the first resin board 15 and the second resin board 16, the second resin base 8 forming the sheet member 14, and the third resin base 86 forming the parallel-plane member 17, a resin base such as glass epoxy, aramid or cyanate-based resin may be used, but different resin bases may be used for the respective components depending on the purpose of the bases. It is considered that if the second resin base 8 is made of a material having a rigidity higher than that of each of the resin bases forming the first resin board 15 and the second resin board 16, deformation and distortion is less likely to occur during pressurization and heating.

It is assumed that the resin boards, the sheet members and the parallel-plane member have the same peripheral size. It is also assumed that a prepreg of epoxy resin or aramid resin is used for the first adhesive members 9, the second adhesive members 10 and the adhesive layer 18 so as to bond these members and outside dimensions thereof are the same as those of the second resin base 8 of the sheet member 14 when viewed from above.

—Specific Design Example of Imaging Module—

Now, an example of designs of the respective components of the imaging module 500 of this embodiment will be described.

The thickness of each of the imaging semiconductor chip 1 and the semiconductor control chip 2 is preferably in the range from 30 μm to 400 μm, both inclusive. This is because if a chip is too thin, the chip has a low mechanical strength and is susceptible to damage, whereas if a chip is too thick, the entire imaging module is also thick.

The first resin board 15 is appropriately designed such that the thickness of the first resin base 7 is in the range from 60 μm to 200 μm, both inclusive, the diameter of the first buried conductors 11 is in the range from 100 μm to 500 μm, both inclusive, and the pitch between the first buried conductors is in the range from 300 μm to 750 μm, both inclusive.

The second resin board 16 is appropriately designed such that the thickness of the first resin base 70 is in the range from 60 μm to 300 μm, both inclusive, the diameter of the first buried conductors 110 and the pitch between the first buried conductors 110 are in the same ranges as those of the first buried conductors 11 in the first resin board 15. It should be noted that in a configuration in which the first resin board 15 and the second resin board 16 are stacked, the thickness of the first resin base 70 of the second resin board 16 is preferably equal to or larger than that of the first resin board 15. Then, distortion of the second resin board 16 sandwiched between the imaging semiconductor chip 1 and the optical member 3 is suppressed.

The imaging opening 19 smaller than the imaging semiconductor chip 1 is formed in a center portion of the first resin base 70 of the second resin board 16.

The sheet member 14 is designed such that the thickness of the second resin base 8 is in the range from 45 μm to 450 μm, both inclusive, and the diameter of the second buried conductors 12 and the pitch between the second buried conductors 12 are in the same ranges as those for the first resin board 15 and the second resin board 16. The opening 20 larger than the imaging semiconductor chip 1 when viewed from above is formed in a center region of the second resin base 8 of the sheet member 14.

In the sheet member 14, each of the first adhesive member 9 and the second adhesive member 10 provided on both surfaces (the upper surface and the lower surface, respectively) of the second resin base 8 has a thickness in the range from 10 μm to 100 μm, both inclusive, and has an opening 201, at its center region, having the same size as that of the opening 20 in the second resin base 8 so that the opening 201 overlaps the opening 20 when viewed from above.

In the parallel-plane member 17, the thickness of the third resin base 86 is in the range from 60 μm to 450 μm, both inclusive, and the diameter of the third buried conductors 13, the pitch between the third buried conductors 13 and the position and size of the opening 200 are the same as those in the second resin base 8 of the sheet member 14. The adhesive layer 18 formed on the upper face of the third resin base 86 in the parallel-plane member 17 has a thickness in the range from 10 μm to 100 μm, both inclusive.

The thickness of the printed circuit board 6 connected to external equipment preferably varies depending on the purpose. The arrangement of the connection lands 23 provided on the lower surface of the printed circuit board 6 is the same as that of the third buried conductors 13 formed in the third resin base 86 of the parallel-plane member 17, and the position and size of the opening 20 are the same as those of the opening 200 formed in the third resin base 86 of the parallel-plane member 17.

The optical member 3 provided over the imaging opening 19 in the first resin base 70 of the second resin board 16 has a thickness in the range from 200 μm to 400 μm, both inclusive, and has outside dimensions larger than those of the imaging opening 19 in the first resin base 70 and smaller than those of the opening 201 in the second resin base 8 of the sheet member 14 when viewed from above.

With the foregoing designs, the imaging module 500 of this embodiment is implemented.

In the imaging module 500, the parallel-plane member 17 exhibiting a small in-plane variation and the second sheet member 14b are provided between the printed circuit board 6 connected to external equipment and the second resin board 16, so that the upper surface of the printed circuit board 6 and an imaging surface of the imaging semiconductor chip 1 are easily kept in parallel with each other with high accuracy.

If the thicknesses of the second resin board 16, the imaging semiconductor chip 1 and the parallel-plane member 17 are increased, resistance to deformation such as a warp or a twist caused by external forces increases. Accordingly, even in a multilevel structure, a warp is greatly reduced. As a result, the upper surface of the printed circuit board 6 and the imaging surface of the imaging semiconductor chip 1 are kept in parallel with each other with higher accuracy.

In the imaging module of this embodiment, the semiconductor control chip 2 and the imaging semiconductor chip 1 are mounted on the first resin board 15 and the second resin board 16, respectively. Accordingly, if a burn-in test, an electrical inspection or an image inspection, for example, is performed after the semiconductor chips have been mounted, only non-defective components are allowed to be stacked, and an imaging module is implemented with high yield.

In addition, during stacking and bonding of the components, the second buried conductors 12 of the sheet member 14 are cured while being compressed through heating and pressurization. This ensures electric connection between the connection lands 23 on the surfaces of the resin boards and the first buried conductors 11. If the second buried conductors 12 are compressed to have a high density, the resistance is reduced. Even if pressure is applied to the upper surface of the printed circuit board 6 at the top of the resin boards and the lower surface of the first resin board 15 at the bottom of the resin boards in stacking and bonding the component at a time, deformation such as contraction does not occur in the second resin base 8 of the sheet member 14. Accordingly, no stress is applied to the imaging semiconductor chip 1. As a result, cracks, for example, in the imaging semiconductor chip 1 or connection failures, for example, are less likely to occur, so that a highly reliable multilevel module is implemented.

—Method for Fabricating Imaging Module—

A method for fabricating an imaging module according to this embodiment will be described with reference to FIGS. 8A through 8C, FIGS. 9A through 9D, FIGS. 10A through 10D, FIGS. 11A through 11F, FIGS. 12A through 12F and FIG. 13.

Figure 8A:
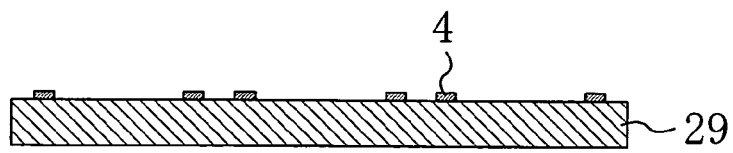
FIGS. 8A through 8C are cross-sectional views showing respective process steps of forming a semiconductor chip to be mounted on the imaging module of the third embodiment.
Figure 8B:
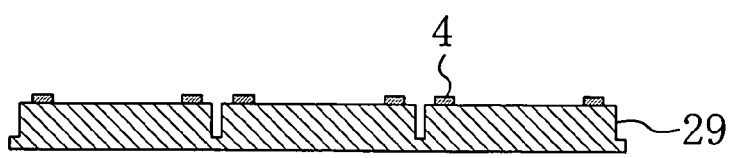
Figure 8C:
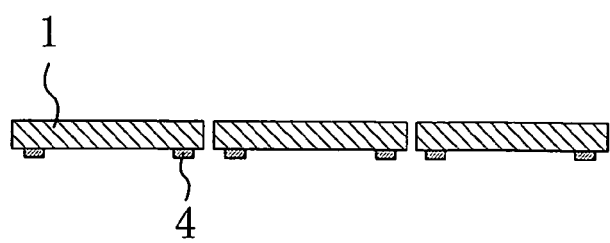

FIGS. 8A through 8C are cross-sectional views showing respective process steps for fabricating a semiconductor chip to be mounted in the imaging module of this embodiment. FIGS. 9A through 9D are cross-sectional views showing respective process steps of forming a first resin board 15. FIGS. 10A through 10D are cross-sectional views showing respective process steps of forming a second resin board. FIGS. 11A through 11F are cross-sectional views showing respective process steps of forming a sheet member. FIGS. 12A through 12F are cross-sectional views showing respective process steps of forming a parallel-plane member. FIG. 13 is a cross-sectional view showing components forming the imaging module of this embodiment in a disassembled state.

Now, an example of a method for forming a thin semiconductor device will be described with reference to FIGS. 8A through 8C. The following description will be given using the imaging semiconductor chip 1 as an example, but other semiconductor chips such as a semiconductor control chip may also be processed in the same manner.

Then, as shown in FIG. 8A, circuit processing necessary for an imaging semiconductor chip 1 is performed on a semiconductor wafer 29. Then, electrode bumps 4 are formed on bonding pads in regions (chip regions) of the semiconductor wafer 29 to be imaging semiconductor chips 1 by, for example, electroplating or stud bump bonding (SBB).

Thereafter, as shown in FIG. 8B, the semiconductor wafer 29 is cut halfway with a dicing saw or by laser radiation from the principal surface along a separation zone of the semiconductor wafer 29.

Subsequently, as shown in FIG. 8C, a portion of the semiconductor wafer 29 is removed from its back surface by, for example, chemical etching, plasma etching, back-face polishing, or by using these techniques so that the removed portion reaches the portion which has been removed at the previous process step. After this process step, separate imaging semiconductor chips 1 are obtained. These process steps are also performed for semiconductor control chips 2. In this embodiment, the thicknesses of each imaging semiconductor chip 1 and semiconductor control chip 2 is 75 μm, but are not limited to this value.

Now, an example of a method for forming a first resin board 15 on which a semiconductor control chip 2 is to be mounted will be described. In this embodiment, as an example of formation of the first resin board 15, glass epoxy resin is used for the first resin base 7 and copper foil 25 is used for a pattern formed on each surface of the first resin base 7.

Figure 9A:
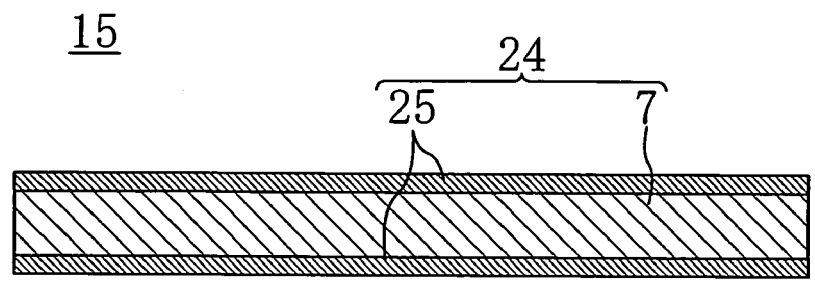
FIGS. 9A through 9D are cross-sectional views showing respective process steps of forming a first resin board used in the imaging module of the third embodiment.

First, as shown in FIG. 9A, a two-side copper-clad board 24 formed by covering both surfaces of the first resin base 7 with copper foil 25 is prepared. In the two-side copper-clad board 24, the copper foil 25 having a thickness of 15 μm is bonded to each surface of the first resin base 7 having a thickness of 75 μm, so that the total thickness of the two-side copper-clad board 24 is about 105 μm.

Figure 9B:
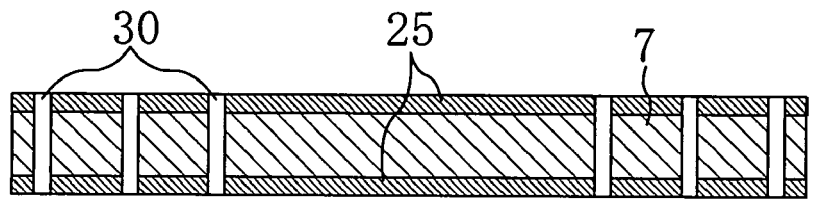

Then, as shown in FIG. 9B, the two-side copper-clad board 24 is irradiated with laser beams focused on given positions, thereby forming through holes 30.

Figure 9C:
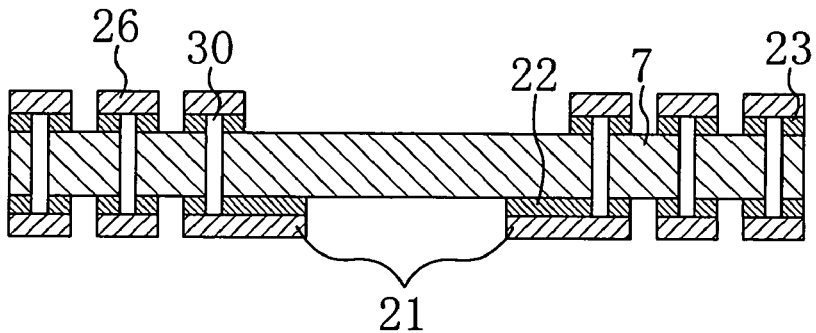

Subsequently, as shown in FIG. 9C, the surfaces of the copper foil 25 are coated with photosensitive films 26 and etching is performed thereon, thereby forming connection lands 23 on one surface of the first resin base 7 and also forming connection terminals 21, connection lands 23 and wires 22 connecting the connection terminals 21 and the connection lands 23 together on the other surface of the first resin base 7. Patterns for these components are formed by photolithography and etching using the photosensitive films 26. After the etching, the photosensitive films 26 on both of the surfaces are peeled off with a peeling solution or by plasma ashing.

Figure 9D:
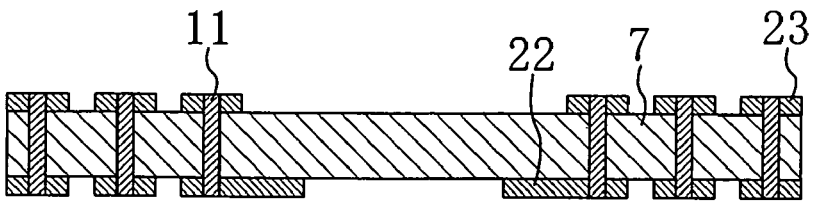

Thereafter, as shown in FIG. 9D, the through holes 30 are filled with, for example, a conductive paste by screen printing or low-pressure injection and then the conductive paste is cured by heating the board, thereby forming first buried conductors 11. In this manner, a first resin board 15 is obtained. The method for forming the resin board and the thicknesses and materials of the base and the copper foil are not limited to the above example. For example, the through holes 30 may be filled with a plating conductor.

Now, an example of a method for forming a second resin board 16 on which the imaging semiconductor chip 1 is to be mounted will be described. In the example of a method for forming a second resin board 16, a resin base also used in the example of a method for forming a first resin board 15 is used but, unlike the example for the first resin board 15, an imaging opening 19 is formed. The resin base used in the following example will be referred to as a first resin base 70. Accordingly, glass epoxy resin is used for the first resin base 70 and copper foil 25 is used for patterns formed on both surfaces of the first resin base 70.

Figure 10A:
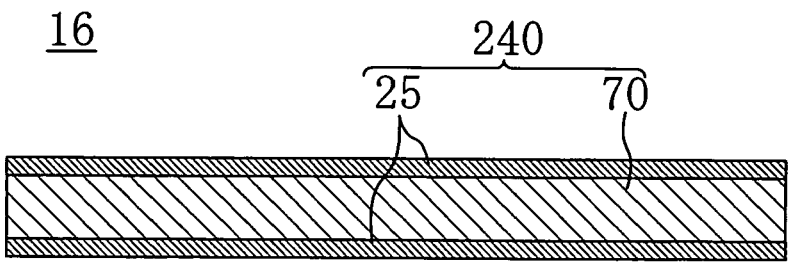
FIGS. 10A through 10D are cross-sectional views showing respective process steps of forming a second resin board used in the imaging module of the third embodiment.

First, as shown in FIG. 10A, a two-side copper-clad board 240 formed by covering both surfaces of the first resin base 70 with copper foil 25 is prepared. Preferably, in the two-side copper-clad board 240, the copper foil 25 having a thickness of 15 μm is bonded to each of the surfaces of the first resin base 70 having a thickness of 150 μm, so that the total thickness of the two-side copper-clad board 240 is 180 μm.

Figure 10B:
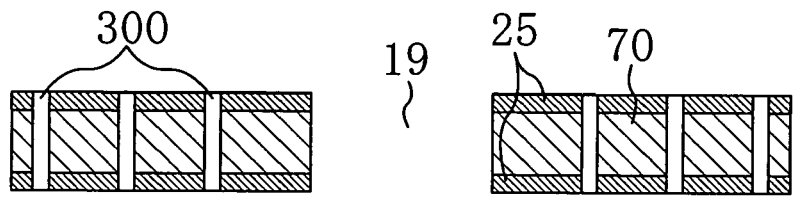

Then, as shown in FIG. 10B, the two-side copper-clad board 240 is irradiated with laser beams focused on given positions thereof, thereby forming through holes 300 and an imaging opening 19. The imaging opening 19 is formed in a center region of the first resin base 70, is smaller than at least the imaging semiconductor chip 1 when viewed from above, and is the same as or larger than the imaging region of the imaging semiconductor chip 1.

Figure 10C:
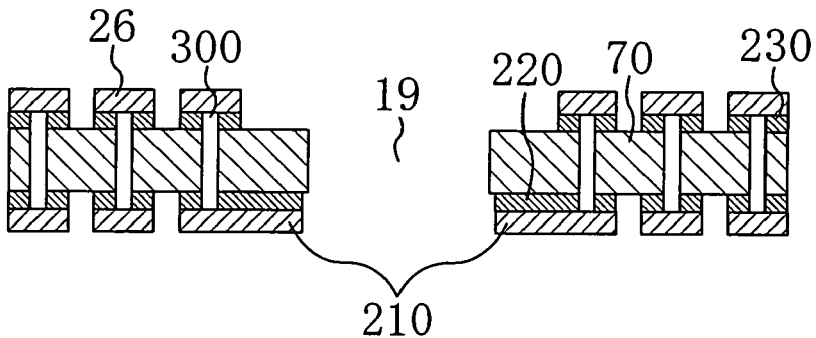

Subsequently, as shown in FIG. 10C, the surfaces of the copper foil 25 are coated with photosensitive films 26 and etching is performed thereon using the photosensitive films 26 as a mask, thereby forming connection lands 230 on one surface of the first resin base 70 and also forming connection terminals 210, connection lands 230 and wires 220 connecting the connection terminals 210 and the connection lands 230 together on the other surface of the first resin base 70. Patterns for these terminals, wires and lands are formed by photolithography and etching using the photosensitive films 26. After the etching, the photosensitive films 26 on the both surfaces are peeled off with a peeling solution or by plasma ashing.

Figure 10D:
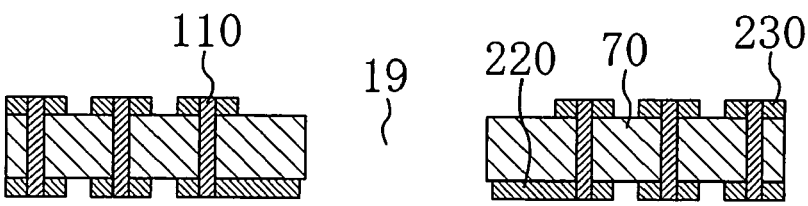

Thereafter, as shown in FIG. 10D, the through holes 300 are filled with, for example, a conductive paste by screen printing or low-pressure injection, and then the conductive paste is cured by heating the board, thereby forming first buried conductors 110. In this manner, a second resin board 16 is obtained. The method for forming the resin board, the thicknesses and materials of the base and the copper foil are not limited to the above example. For example, the through holes 300 may be filled with a plating conductor.

Now, an example of a method for forming a second resin base 8 forming the sheet member 14 will be described. In the following example, glass epoxy resin is used as a material for the second resin base 8 as in the example of a method for forming the first resin board 15.

Figure 11A:
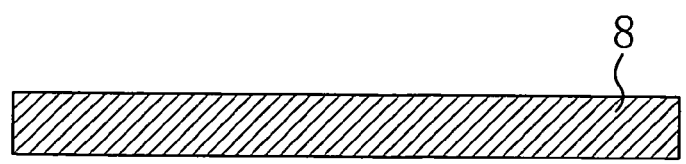
FIGS. 11A through 11F are cross-sectional views showing respective process steps of forming a sheet member used in the imaging module of the third embodiment.

First, as shown in FIG. 11A, a second resin base 8 is prepared. The thickness of this second resin base 8 is preferably 100 μm.

Figure 11B:
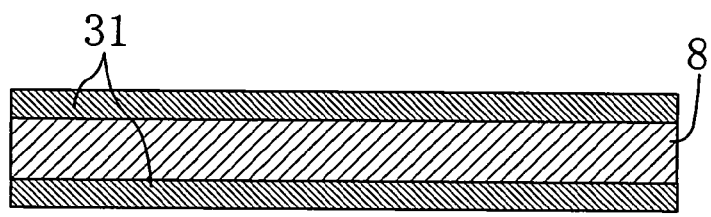

Then, as shown in FIG. 11B, heat-resistance protective films 31 made of polyimide or PET (polyethylene terephthalate) resin are formed on both surfaces of the second resin base 8.

Figure 11C:
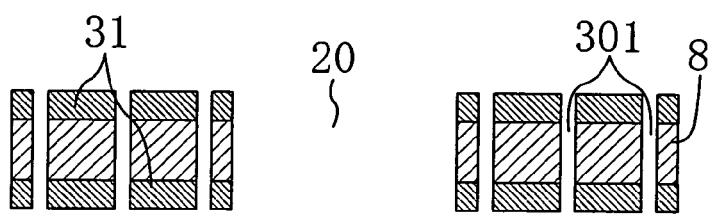

Subsequently, as shown in FIG. 11C, the second resin base 8 provided with heat-resistance protective films 31 is irradiated with laser beams focused on given positions thereof, thereby forming through holes 301 and an opening 20. Thereafter, the heat-resistance protective films 31 are peeled off. The opening 20 is formed in a center region of the second resin base 8, and is larger than at least the imaging semiconductor chip 1 when viewed from above.

Figure 11D:
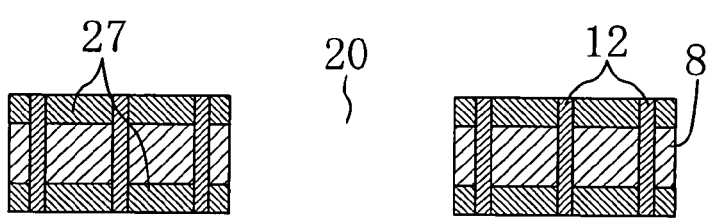

Then, as shown in FIG. 11D, masking films 27 in each of which holes and a window are formed at positions corresponding to the through holes 301 and the opening 20, respectively, are attached to both surfaces of the second resin base 8. The through holes 301 in the second resin base 8 and the holes in the masking films 27 are filled with, for example, a conductive paste by screen printing or low-pressure injection. The holes formed in the masking films 27 are used to form projections 33 of the second buried conductors 12.

Figure 11E:
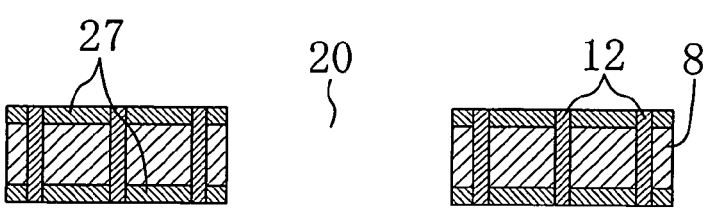

Thereafter, as shown in FIG. 11E, the conductive paste in the through holes 301 and the holes in the masking films 27 is dried. In this state, the second buried conductors 12 are in a semi-cured state.

Figure 11F:
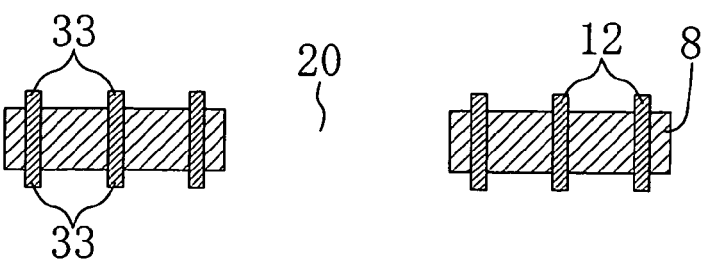

Subsequently, as shown in FIG. 11F, the masking films 27 are peeled off, thereby forming a second resin base 8 provided with the projections 33 on both surfaces of the sheet member 14. Since the second buried conductors 12 formed in this process step are still in the semi-cured state, application of heat and pressure after stacking of resin boards causes the second buried conductors 12 to be compressed and cured to adhere to connection lands of, for example, the resin boards. The method for forming the resin base and the thickness of material of the base are not limited to the foregoing method, thickness and material.

Now, an example of a method for forming a parallel-plane member 17 will be described. In the following example, glass epoxy resin is used for a third resin base 86 of the parallel-plane member 17 as in the example for the first resin board 15.

Figure 12A:
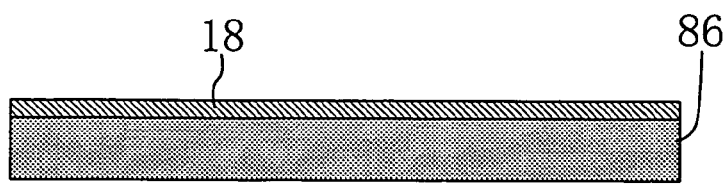
FIGS. 12A through 12F are cross-sectional views showing respective process steps of forming a parallel-plane member used in the imaging module of the third embodiment.
Figure 13:
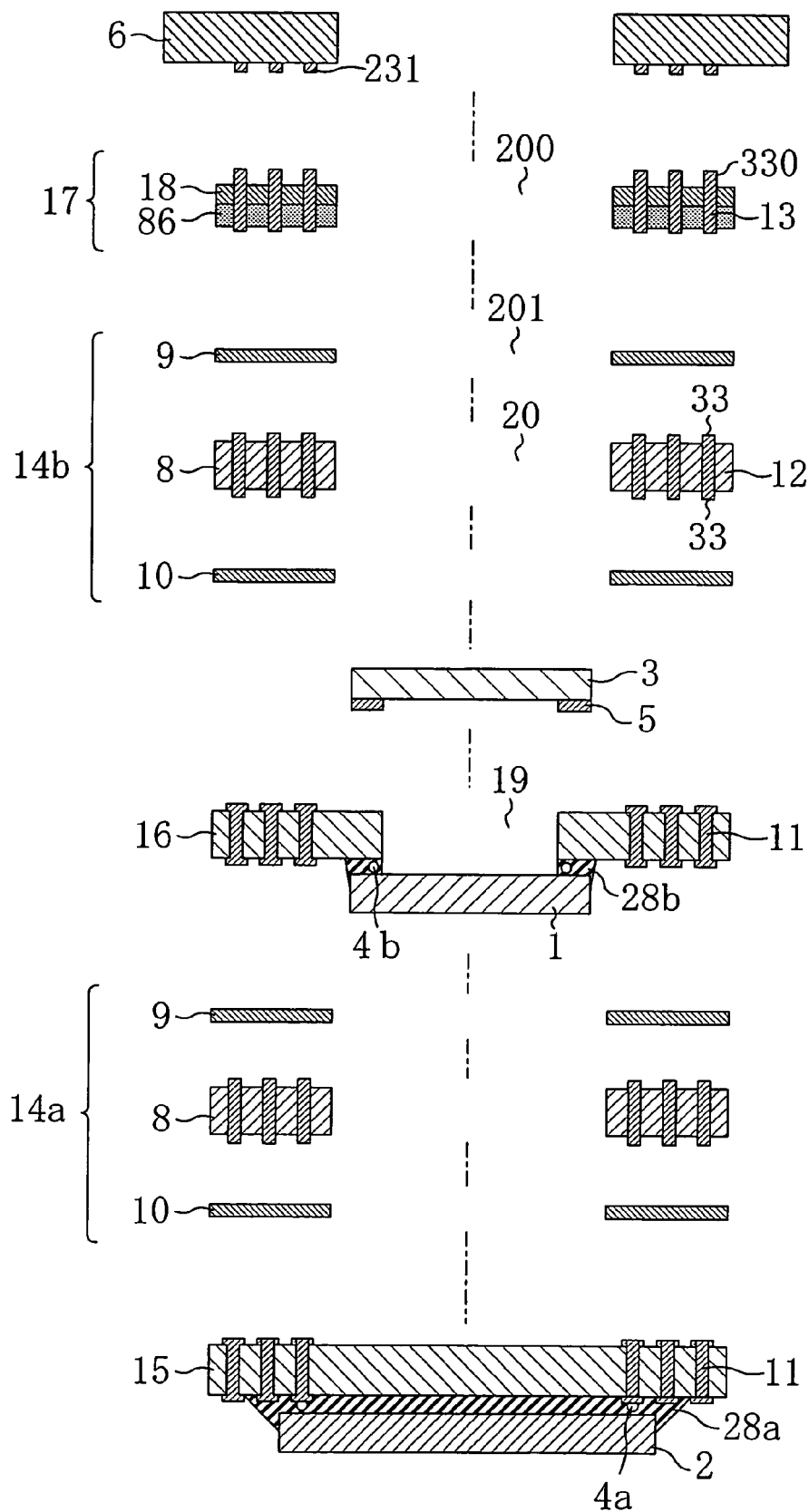
FIG. 13 is a cross-sectional view illustrating components of the imaging module of the third embodiment in a disassembled state.

First, as shown in FIG. 12A, a third resin base 86 provided with, at its upper surface, an adhesive layer 18 which is softened to be adhesive by heating is prepared. In this embodiment, the thickness of the third resin base 86 is preferably 300 μm in order to set the thickness of an optical member 3, which will be described later, at 300 μm.

Figure 12B:
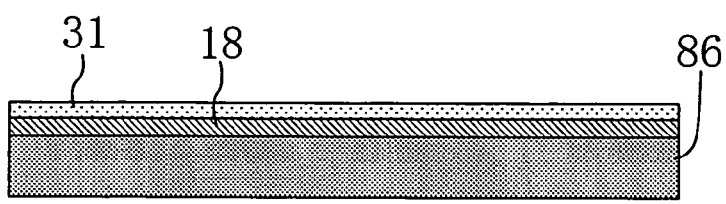

Then, as shown in FIG. 12B, heat-resistance protective films 31 made of polyimide or PET resin are formed on the surface of the third resin base 86 on which an adhesive layer is to be formed.

Figure 12C:
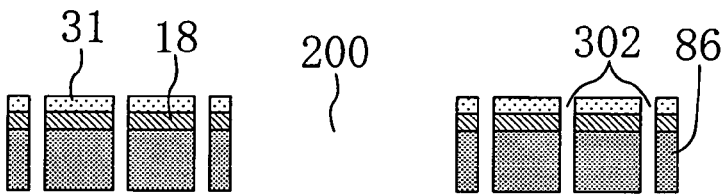

Subsequently, as shown in FIG. 12C, the third resin base 86 provided with the heat-resistance protective film 31 is irradiated with laser beams focused on given positions thereof, thereby forming through holes 302 and an opening 200. Thereafter, the heat-resistance protective film 31 is peeled off. The opening 200 is formed in a center region of the third resin base 86, and having outside dimensions larger than those of at least the imaging semiconductor chip 1 when viewed from above and equal to those of the opening 20 formed in the second resin base 8 of the sheet member 14 when viewed from above.

Figure 12D:
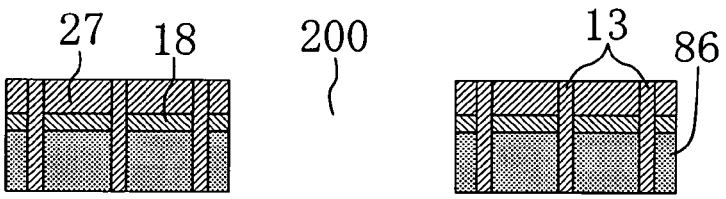

Then, as shown in FIG. 12D, a masking film 27 in which holes and a window are formed at positions corresponding to the through holes 302 and the opening 200, respectively, is attached to the surface of the third resin base 86 on which an adhesive layer 18 is to be formed. The holes 301 formed in the masking film 27 are used for forming projections 330 of the third buried conductors 13. Subsequently, the through holes 302 in the third resin base 86 and the holes in the masking film 27 are filled with, for example, a conductive paste by screen printing or low-pressure injection.

Figure 12E:
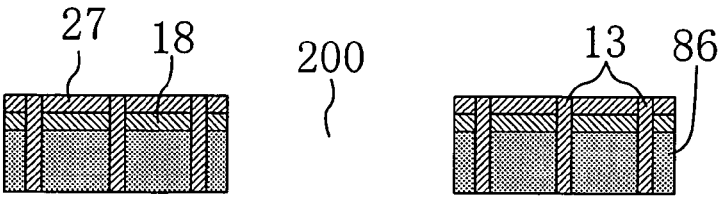

Thereafter, as shown in FIG. 12E, the conductive paste in the through holes 302 and the holes in the masking film 27 are dried, thereby forming third buried conductors 13.

Figure 12F:
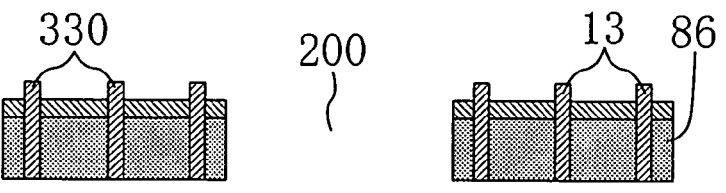

Subsequently, as shown in FIG. 12F, the masking film 27 is peeled off, thereby forming a parallel-plane member 17 in which projections 330 are formed on the surface of the third resin base 86 on which an adhesive layer 18 is provided. In this process step, the third buried conductors 13 are still in a semi-cured state, so that application of heat and pressure causes the third buried conductors 13 to be compressed and cured and the projections 330 are bonded to connection lands 231 formed on the lower surface of the printed circuit board 6. The method for forming the resin base and the thickness of material of the base are not limited to the foregoing method, thickness and material.

Now, an example of a method for forming a first adhesive member 9 and a second adhesive member 10 provided on both surfaces of the second resin base 8 in the sheet member 14 will be described. In the following example, the first adhesive member 9 uses an epoxy prepreg.

First, an epoxy prepreg which is softened to be adhesive when heated is prepared. In this embodiment, the thickness of the epoxy prepreg is preferably 15 μm. Then, an opening 201 having the same size and located at the same position as the opening 20 in the second resin base 8 is formed by processing using punching by presswork or using radiation of laser light. The method for forming the adhesive members and the thickness and material thereof are not limited to the foregoing method, thickness and material.

Now, a method for mounting the semiconductor control chip 2 and the imaging semiconductor chip 1 on the first resin board 15 and the second resin board 16, respectively, will be described.

First, alignment is performed with a paste of solder or a conductive resin interposed between the electrode bumps 4a on the principal surface of the semiconductor control chip 2 and the connection terminals 21 of the first resin board 15, and then the module is heated in a reflow furnace or a heating furnace, thereby bonding the electrode bumps 4a and the connection terminals 21 together.

Then, a sealing resin 28a in a liquid state is injected into a gap formed between the first resin board 15 and the semiconductor control chip 2. After the sealing resin 28a has been spread out over the gap, the sealing resin 28a is cured by heating. In this manner, the principal surface of the semiconductor control chip 2 is sealed and the first resin board 15 and the semiconductor control chip 2 are bonded and fixed together.

In the same manner, the second resin board 16 and the imaging semiconductor chip 1 are bonded and fixed together. A method for bonding the electrode bumps 4b on the imaging semiconductor chip 1 and the second resin board 16 together is similar to that for bonding the semiconductor control chip 2 and the imaging semiconductor chip 1 together, and thus description thereof is omitted. Thereafter, a sealing resin 28b in a liquid state is injected into a gap formed between the second resin board 16 and the imaging semiconductor chip 1. At this time, the sealing resin 28b is applied only to a peripheral portion of the imaging semiconductor chip 1 other than the imaging region thereof, and then is cured by heating. In this manner, the second resin board 16 and the imaging semiconductor chip 1 are bonded together and fixed with the sealing resin 28b interposed therebetween.

In the foregoing manner, a structure in which the semiconductor chips are mounted on the first resin board 15 and the second resin board 16, respectively, is obtained. Thereafter, if an electrical inspection, an image inspection or a burn-in test is performed, the reliability of the semiconductor chips mounted on the resin boards is enhanced to the same degree as that of a semiconductor chip incorporated in a conventional single-chip semiconductor package.

Now, it will be described how the first resin board 15 on which the semiconductor control chip 2 is mounted, the second resin board 16 on which the imaging semiconductor chip 1 is mounted and the printed circuit board 6, formed in the methods described above, are stacked using the parallel-plane member 17 and the sheet members 14 and these components are united.

As illustrated in FIG. 13, a second adhesive member 10, a second resin base 8, a first adhesive member 9, a second resin board 16 on which an imaging semiconductor chip 1 is mounted, a second adhesive member 10, a second resin base 8, a first adhesive member 9, a parallel-plane member 17 and a printed circuit board 6 are stacked in this order over a first resin board 15.

In this configuration, the first resin board 15 and the second resin board 16 are oriented such that the surfaces thereof on which the semiconductor control chip 2 and the imaging semiconductor chip 1 are respectively mounted are located as their lower surfaces. These components are aligned such that the imaging semiconductor chip 1 mounted on the second resin board 16 is housed in an opening 20 in a second sheet member 14b. Connection lands 23 on the first resin board 15, connection lands 230 on the second resin board 16 and connection lands 231 on the printed circuit board 6 are located such that positional deviation of these connection lands from projections 33 of second buried conductors 12 in a first sheet member 14a and the second sheet member 14b and projections 330 of third buried conductors 13 in the parallel-plane member 17 is minimized. A thin component having high resistance to heat, e.g., a cover glass, included in an optical member 3 or a temporary metal cover may be provided over the imaging surface of the imaging semiconductor chip 1 in order to protect the imaging surface in this process step.

The components are stacked in the foregoing manner and brought into close contact with each other, and then heat and pressure are applied to these stacked components, so that adhesive members formed on the upper and lower surfaces of the sheet members 14 and an adhesive layer 18 of the parallel-plane member 17 are softened, thereby allowing the components to be bonded together and united. The connection lands 23 and 231 on the resin boards and the printed circuit board 6 are in mechanical contact with, and electrically connected to, the projections 33 and 330 of the buried conductors in the sheet members 14 through the softened adhesive members. Thereafter, heat and pressure are applied to the stacked components for a given period and then the components are cooled and taken out, so that the stacked components are united to be a multilevel structure.

In forming the multilevel structure, instead of using the first adhesive members 9 and the second adhesive members 10, adhesive layers which are softened by heating to be adhesive may be previously formed on a region of the upper surface (i.e., the surface facing the surface on which the semiconductor control chip 2 is mounted) of the first resin board 15 and regions of the upper and lower surfaces of the second resin board 16 except for regions on which the connection lands 23 and 230 are formed and a region adjacent to the opening 20 of the sheet members 14.

Alternatively, instead of the adhesive layer 18 of the parallel-plane member 17, an adhesive layer may be previously formed on a region of the printed circuit board 6 connected to the parallel-plane member 17 other than a region on which the connection lands 231 are formed and a region in which the opening 200 is formed.

Then, in the multilevel structure in which a plurality of components are united, the optical member 3 such as a cover glass, a transparent resin or an optical filter, having a thickness of 300 μm and larger than the imaging opening 19 when viewed from above, is bonded to the upper surface of the second resin board 16 on which the imaging semiconductor chip 1 is mounted, using an optical-member adhesive 5, thereby obtaining an imaging module 500 of this embodiment. As described above, a process in which out of the optical member 3, a component having high resistance to heat, such as a cover glass, is provided before heating and pressurization and a component having low resistance to heat, such as a plastic component, is provided after the heating and pressurization may be adopted.

According to the foregoing method for forming the imaging module 500 of this embodiment, the parallel-plane member 17 exhibiting an extremely small variation in in-plane thickness is used and the second resin board 16 has a large thickness, so that occurrence of a warp is suppressed even during stacking, heating and bonding, for example, for forming a module. Accordingly, the imaging surface of the imaging semiconductor chip 1 and the upper surface of the printed circuit board 6 are kept in parallel with each other with high accuracy as required in the imaging module 500. If the parallel-plane member 17 has a large thickness, occurrence of a warp is also suppressed.

EMBODIMENT 4

Hereinafter, an imaging module 510 according to a fourth embodiment of the present invention will be described with reference to FIGS. 14A through 14C and FIG. 15. In the figures, the thicknesses and lengths of respective components differ from those in an actual module for convenience of making the figures and are modified for simplicity. The same holds for the subsequent figures. Materials for the respective components are the same as those in the imaging module of the first embodiment, and thus detailed description thereof will be omitted.

Figure 15:
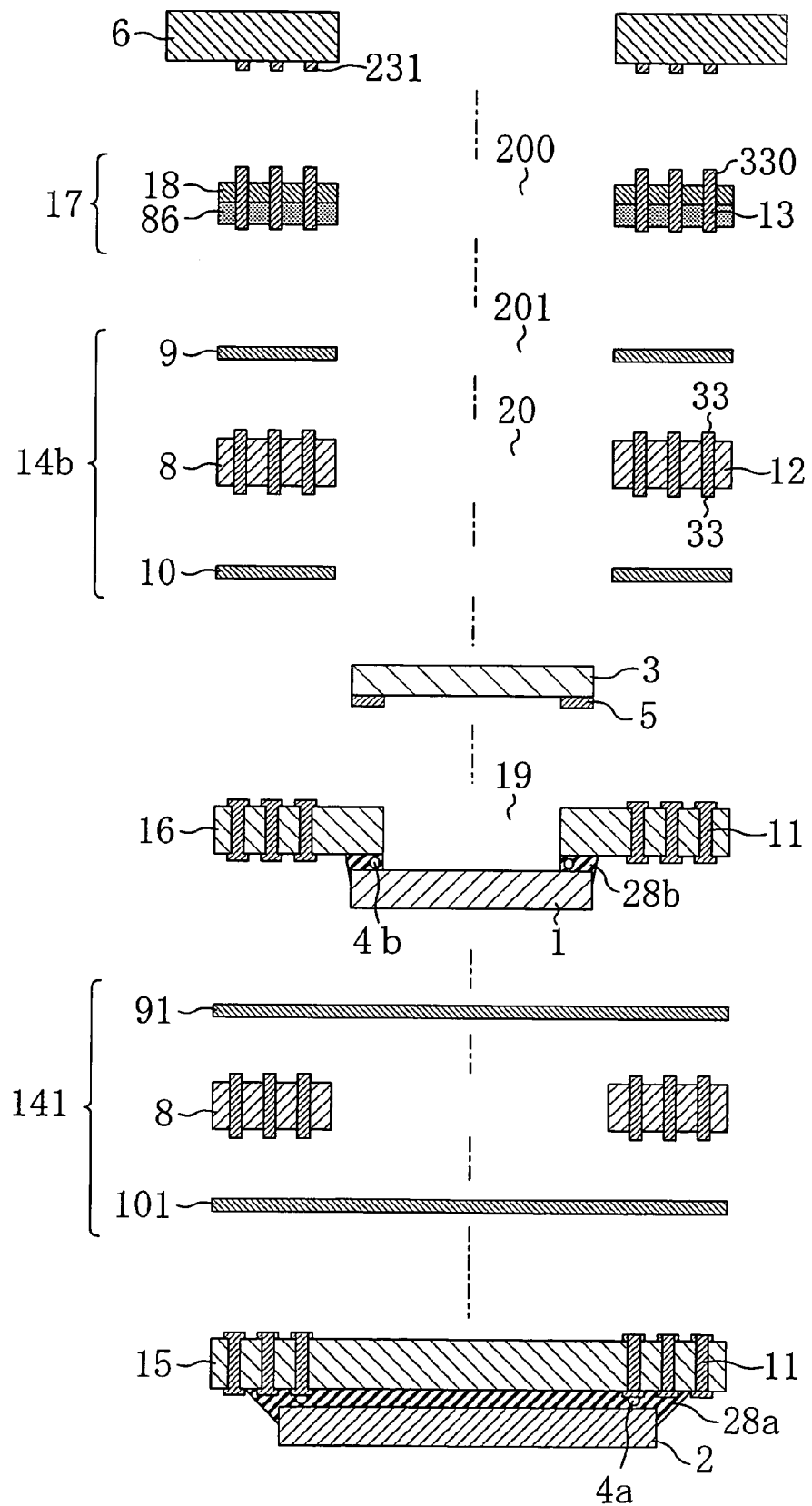
FIG. 15 is a cross-sectional view illustrating components of the imaging module of the fourth embodiment in a disassembled state.

FIG. 14A is a cross-sectional view illustrating a configuration of an imaging module 510 of this embodiment. FIG. 14B is a plan view showing an adhesive member used in the imaging module 510 of this embodiment. FIG. 14C is a view showing a cross section of the adhesive member taken along the line XIVb-XIVb in FIG. 14B. FIG. 14A shows a cross section taken along a center line of the imaging module 510 in plan view. FIG. 15 is a cross-sectional view illustrating respective components of the imaging module 510 of this embodiment in a disassembled state.

The imaging module 510 of this embodiment is different from the imaging module 500 of the third embodiment in that no opening 201 is provided in a first adhesive member 91 and a second adhesive member 101 forming a first sheet member 141 placed on a first resin board 15, as understood from a comparison between FIG. 13 and FIG. 15.

The first adhesive member 91 and the second adhesive member 101 of the first sheet member 141 are softened when the stacked components are heated, and part of these adhesive members are flown to a peripheral portion of the back surface of the imaging semiconductor chip 1. Accordingly, the imaging module 510 of this embodiment is characterized in that the back surface of the imaging semiconductor chip 1 is covered and a gap between the imaging semiconductor chip 1 and the second resin base 8 and a gap between the imaging semiconductor chip 1 and the first resin board 15 are filled.

Now, a process in which the first resin board 15 on which a semiconductor control chip 2 is mounted, a second resin board 16 on which the imaging semiconductor chip 1 is mounted, a parallel-plane member 17, a printed circuit board 6, a first sheet member 141 and a second sheet member 14b are stacked and united to form an imaging module 510 of this embodiment will be described with reference to FIG. 15.

As illustrated in FIG. 15, the first sheet member 141, the second resin board 16, the second sheet member 14b, the parallel-plane member 17 and the printed circuit board 6 are stacked in this order over the first resin board 15. The stacking direction of the components, alignment targets for the components, and an alignment method are the same as those in the first through third embodiments, and thus description thereof will be omitted.

In this manner, the components are stacked and brought into close contact with each other, and then heat and pressure are applied to the upper surface of the printed circuit board 6 at the top and the lower surface of the first resin board 15 at the bottom, thereby bonding the stacked components together. At this time, a first adhesive member 91 and a second adhesive member 101 in the first sheet member 141 are softened, and part of these adhesive members flows into an opening 20 of the second resin base 8 in which the imaging semiconductor chip 1 is housed. In this manner, a gap between the back surface of the imaging semiconductor chip 1 mounted on the second resin board 16 and the upper surface of the first resin board 15 is filled with an adhesive member. In addition, the first adhesive member 91 and the second adhesive member 101 provided at the upper and lower surfaces, respectively, of the first sheet member 141, the first adhesive member 9 and the second adhesive member 10 provided at the upper and lower surfaces, respectively, of the second sheet member 14b, and the adhesive layers 18 of the parallel-plane member 17 are softened to be adhesive, thereby bonding and uniting the stacked components together. The first resin board 15 and the second resin board 16 are bonded together, and connection lands 231 of the printed circuit board 6 are brought into mechanical contact with projections 330 of the sheet members to have electrical connection. In this manner, a multilevel structure is obtained.

In the multilevel structure in which a plurality of components are stacked and united, an optical member 3 such as a cover glass, a transparent resin or an optical filter, having a thickness of 300 μm and larger than an imaging opening 19 when viewed from above, is bonded to the upper surface of the second resin board 16 on which the imaging semiconductor chip 1 is mounted, using an optical-member adhesive 5, thereby obtaining an imaging module 510.

According to the foregoing method for forming the imaging module 510 of this embodiment, the parallel-plane member 17 exhibiting an extremely small variation in in-plane thickness is used and the second resin board 16 has a large thickness and, in addition, the side face as well as the back surface of the imaging semiconductor chip 1 is covered with the adhesive members, so that occurrence of a warp is suppressed after heating and pressurization for making a module. In addition, the imaging surface of the imaging semiconductor chip 1 and the upper surface of the printed circuit board 6 are kept in parallel with each other with high accuracy as required in the imaging module 510 in which the imaging semiconductor chip 1 is mounted.

EMBODIMENT 5

Hereinafter, an imaging module 520 according to a fifth embodiment of the present invention will be described with reference to FIG. 16, FIGS. 17A through 17F and FIG. 18. In the figures, the thicknesses and lengths of respective components differ from those in an actual module for convenience of making the figures and are modified for simplicity.

Figure 16:
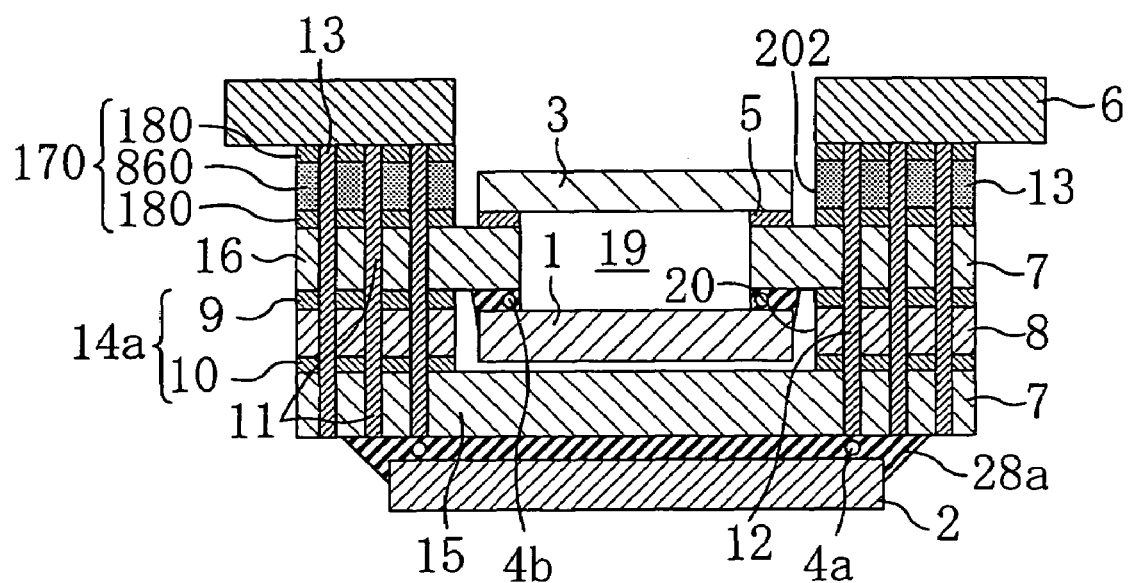
FIG. 16 is a cross-sectional view illustrating an imaging module of a fifth embodiment of the present invention.

FIG. 16 is a cross-sectional view illustrating a configuration of an imaging module 520 of this embodiment. FIG. 16 shows a cross section taken along a center line of the imaging module 520 in plan view. As shown in FIG. 16, the imaging module 520 of this embodiment is characterized in that the sheet members 14 used in the imaging module 500 of the third embodiment are omitted and a second resin board 16 and a parallel-plane member 170 are directly stacked and bonded together.

Unlike the parallel-plane member 17 of the third embodiment, for the parallel-plane member 170 of this embodiment, adhesive layers 180 which are softened by heating to be adhesive are previously formed on the upper and lower surfaces of a third resin base 860.

As an example of shapes and dimensions of the components, the parallel-plane member 170 has a thickness of 330 µm, the third resin base 860 has a thickness of 300 µm, and each of the adhesive layers 180 formed on both surfaces of the third resin base 860 has a thickness of 15 µm. As an example of materials of the components, the third resin base 860 is made of glass epoxy resin or bismaleimide triazine (BT) resin and the adhesive layers 180 are made of epoxy resin, aramid resin or a prepreg of a thermoplastic resin, for example. The configuration of this embodiment may be applied to the imaging module 510 of the second embodiment.

Figure 17A:
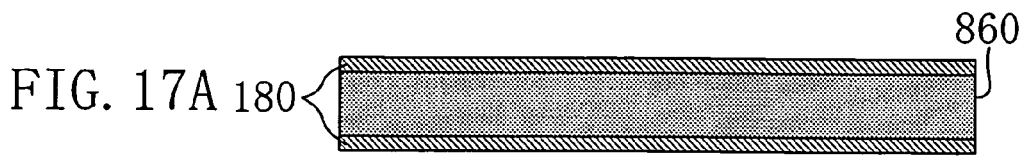
FIGS. 17A through 17F are cross-sectional views showing respective process steps of forming a parallel-plane member used in the imaging module of the fifth embodiment.

Now, an example of a method for forming a parallel-plane member 170 will be described with reference to FIGS. 17A and 17F. FIGS. 17A and 17F are cross-sectional views showing respective process steps of forming a parallel-plane member for use in the imaging module of this embodiment.

First, as shown in FIG. 17A, a third resin base 860 in the shape of a sheet provided with, on its upper and lower surfaces, adhesive layers 180 which are softened by heating to be adhesive is prepared.

Figure 17B:
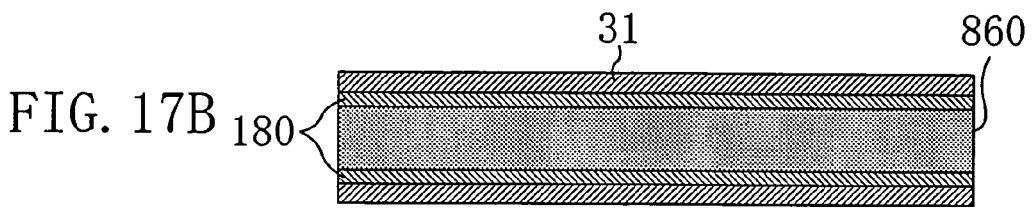

Then, as shown in FIG. 17B, heat-resistance protective films 31 made of, for example, polyimide or PET resin are formed on the adhesive layers 180 formed on the upper and lower surfaces of the third resin base 860.

Figure 17C:
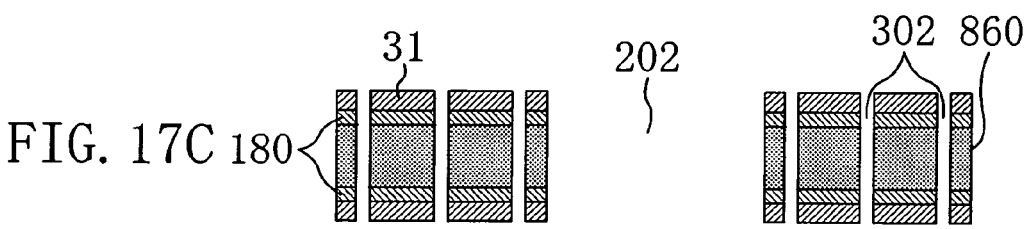

Thereafter, as shown in FIG. 17C, through holes 302 and an opening 202 having the same sizes and located at the same positions as through holes 301 and an opening 20, respectively, formed in a sheet member 14 when view from above are formed, and then the heat-resistance protective films 31 are peeled off. The positions of the through holes 301 and the opening 20 in the sheet member 14 are the same as those in the sheet members 14 of the imaging module 500 of the third embodiment.

Figure 17D:
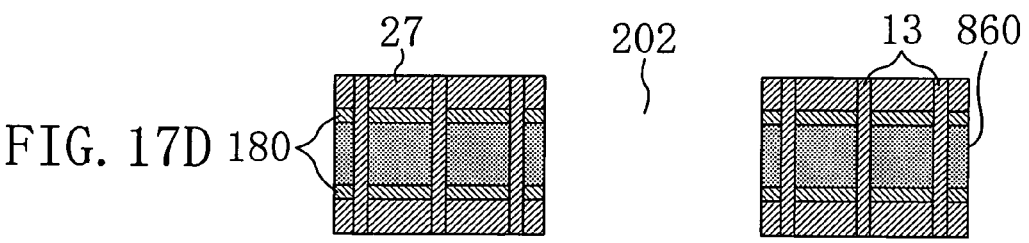

Subsequently, as shown in FIG. 17D, masking films 27 in each of which holes and a window are formed at positions corresponding to the through holes 302 and the opening 202, respectively, of the third resin base 860 are attached to both surfaces of the third resin base 860. The holes formed in the masking films 27 are used for forming projections 330 of third buried conductors 13. Subsequently, the through holes 302 in the third resin base 860 and the holes in the masking film 27 are filled with a conductive paste by, for example, screen printing or low-pressure injection.

Figure 17E:
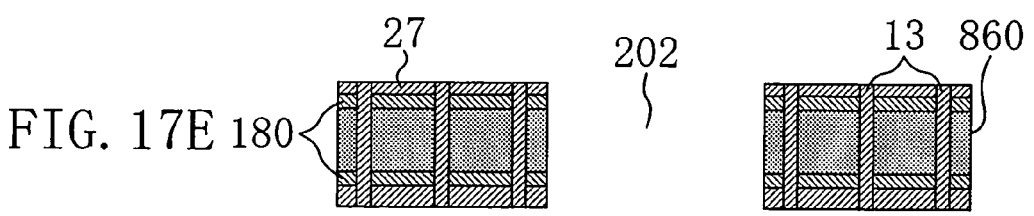
Figure 17F:
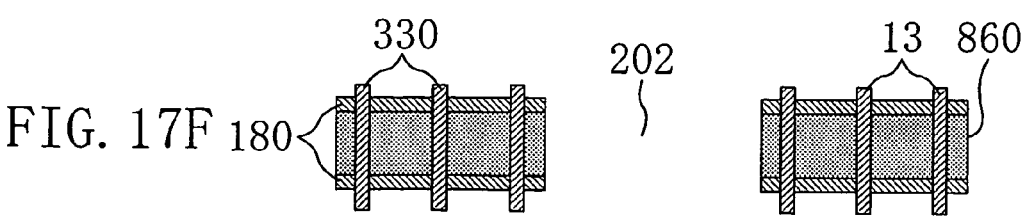

Thereafter, as shown in FIG. 17E, the conductive paste in the through holes 302 and the holes in the masking film 27 is dried. In this state, the third buried conductors 13 are in a semi-cured state.

Subsequently, as shown in FIG. 17F, the masking films 27 formed on the upper and lower surfaces of the third resin base 860 are peeled off, thereby forming a parallel-plane member 170 in which the adhesive layers 180 are provided on the upper and lower surfaces of the third resin base 860 and projections 330 projecting from the adhesive layers 180 on the upper and lower surfaces are provided. The third buried conductors 13 are still in the semi-cured state, so that the third buried conductors 13 has the property of being compressed and cured when subjected to application of heat and pressure.

Now, a process in which the first resin board 15 and the second resin board 16 on which the semiconductor chips are respectively mounted and the printed circuit board 6 are united using the sheet members 14 and the parallel-plane member 170 will be described.

Figure 18:
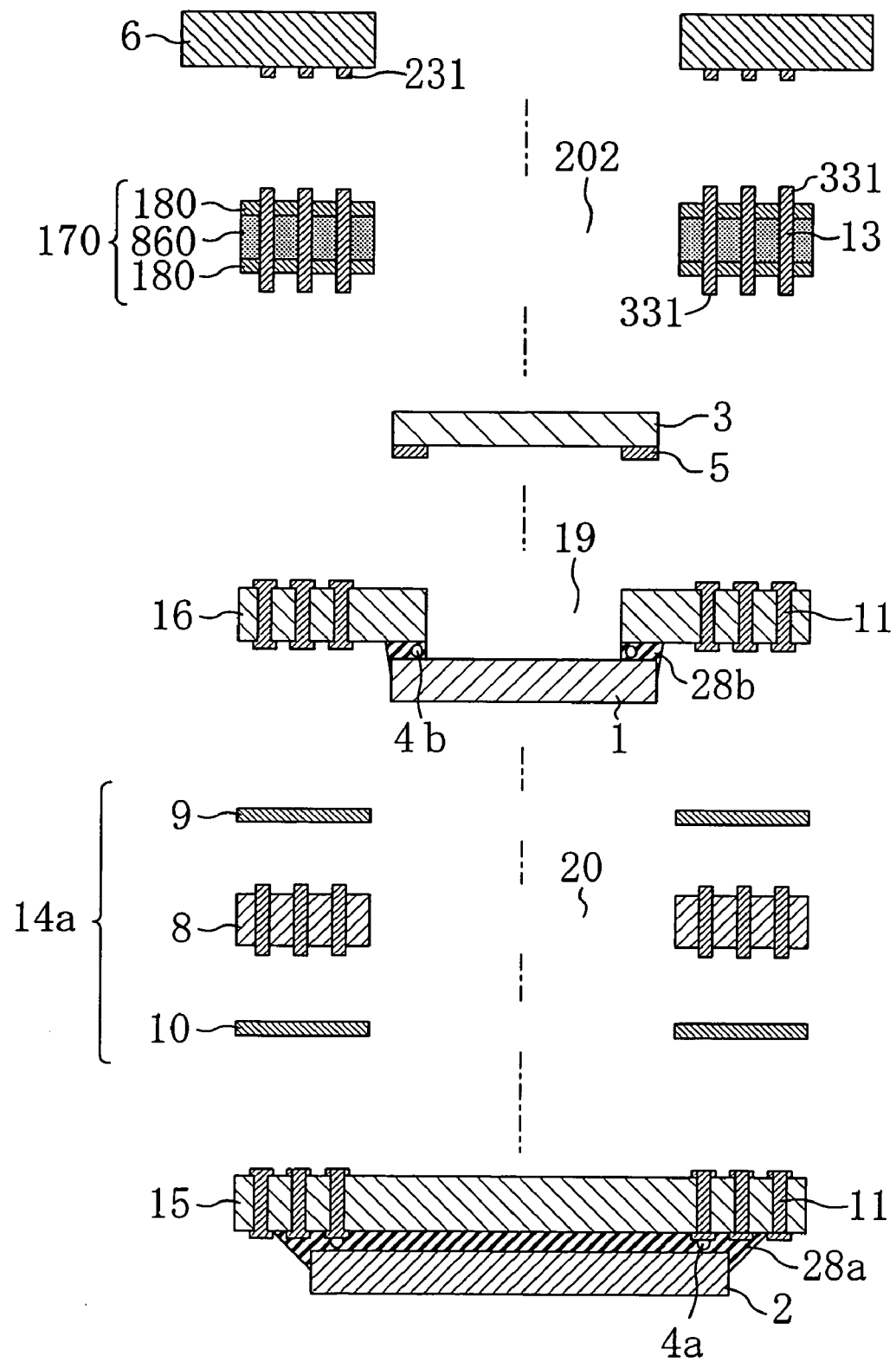
FIG. 18 is a cross-sectional view illustrating components of the imaging module of the fifth embodiment in a disassembled state.

FIG. 18 is a cross-sectional view illustrating respective components of the imaging module 520 of this embodiment in a disassembled state.

As illustrated in FIG. 18, a first sheet member 14a, a second resin board 16 on which an imaging semiconductor chip 1 is mounted, a parallel-plane member 170 and a printed circuit board 6 are stacked in this order over a first resin board 15 on which a semiconductor control chip 2 is mounted. In this configuration, the stacking direction of the components, alignment targets for the components, and an alignment method are the same as those in the first through third embodiments, and thus description thereof will be omitted.

The components stacked in the foregoing manner are brought into close contact with each other, and then heat and pressure are applied to the upper surface of the printed circuit board 6 at the top and the lower surface of the first resin board 15 at the bottom, thereby bonding the stacked components together. The first resin board 15 and the second resin board 16 are bonded together, and connection lands 23, 230 and 231 are brought into mechanical contact with projections 33 and 331 of buried conductors in sheet members to have electrical connection. In this manner, a multilevel structure is obtained.

In the united multilevel structure, an optical member 3 such as a cover glass, a transparent resin or an optical filter, having a thickness of 300 µm and larger than an imaging opening 19 when viewed from above, is bonded to the upper surface of the second resin board 16 to cover the imaging opening 19 in the second resin board 16, using an optical-member adhesive 5, thereby obtaining an imaging module 520 of this embodiment.

According to the configuration of the imaging module 520 of this embodiment and the method for forming the module, the sheet member 14 provided between the second resin board 16 and the parallel-plane member 170 is omitted, so that the size of the module and the cost are reduced, as compared to the imaging module of the third embodiment. In addition, the parallel-plane member 170 exhibiting an extremely small variation in in-plane thickness has a thickness larger than that in the imaging module of the third embodiment, so that occurrence of a warp in the imaging module 520 after stacking and bonding is suppressed. In addition, an imaging surface of the imaging semiconductor chip 1 and the upper surface of the printed circuit board 6 are kept in parallel with each other with high accuracy as required in the imaging module 520.

This embodiment is described with reference to the third embodiment. However, as in the fourth embodiment, the periphery of the imaging semiconductor chip 1 may be surrounded with a resin.

EMBODIMENT 6

Hereinafter, an imaging module 530 according to a sixth embodiment of the present invention will be described with reference to FIG. 19, FIGS. 20A and 20B and FIG. 21.

FIG. 19 is a cross-sectional view illustrating a configuration of an imaging module 530 according to this embodiment. FIG. 19 shows a cross section taken along a center line in plan view.

As shown in FIG. 19, the imaging module 530 of this embodiment is similar to the imaging module 500 of the third embodiment but is different in that a rigid plate 36 surrounding a semiconductor control chip 2 is attached to the surface of a first resin board 15 on which the semiconductor control chip 2 is mounted using an adhesive layer 181.

FIG. 20A is a plan view showing an example of the rigid plate 36 in the imaging module 530 of this embodiment. FIG. 20B is a view showing a cross section taken along the line XXb-XXb in FIG. 20A.

As shown in FIGS. 20A and 20B, an opening 203 lager than the semiconductor control chip 2 when viewed from above is formed in the rigid plate 36. The outside dimensions of the rigid plate 36 are preferably the same as those of the first resin board 15 when viewed from above, and the thickness of the rigid plate 36 is preferably equal to or larger than the height of the semiconductor control chip 2 mounted on the first resin board 15. The rigid plate 36 preferably has a thermal conductivity and a bending strength higher than those of the first resin board 15 and a linear thermal expansion coefficient smaller than that of the first resin board 15. As an example of a material for the rigid plate 36, a copper plate, a metal plate, an aluminum plate, an iron-nickel alloy plate, an alumina plate, a ceramic plate such as a zirconia plate, or a resin plate in which powders of a metal or a highly thermal conductive material are mixed may be used.

The rigid plate 36 may be bonded to the first resin board 15 simultaneously with bonding of the components in the module performed by applying heat and pressure thereto. The configuration of the imaging module of this embodiment may be applied to the imaging modules 510 and 520 of the fourth and fifth embodiments.

As an example of effective application of the rigid plate 36, if a warp occurring in the imaging module 500 of the third embodiment formed through the heating and pressurization is measured and a rigid plate 36 having the property of canceling the obtained value of the warp is selected, occurrence of a warp is especially effectively suppressed. If the imaging module itself is very thin and is susceptible to elastic deformation, the rigid plate 36 is preferably attached to the imaging module before heating and pressurization. For example, if a warp in a particular direction occurs with high reproducibility in forming an imaging module 500, a rigid plate 36 having the property of canceling the warp during heating and pressurization may be placed at the bottom to be subjected to heating and pressurization together with the other components of the module. In this manner, to cancel a warp, it is sufficient to select, by calculation, a material and a thickness which exhibit a linear thermal expansion coefficient varying depending on the direction of the warp.

Now, a process in which the components are stacked and united to form an imaging module of this embodiment will be described.

Figure 21:
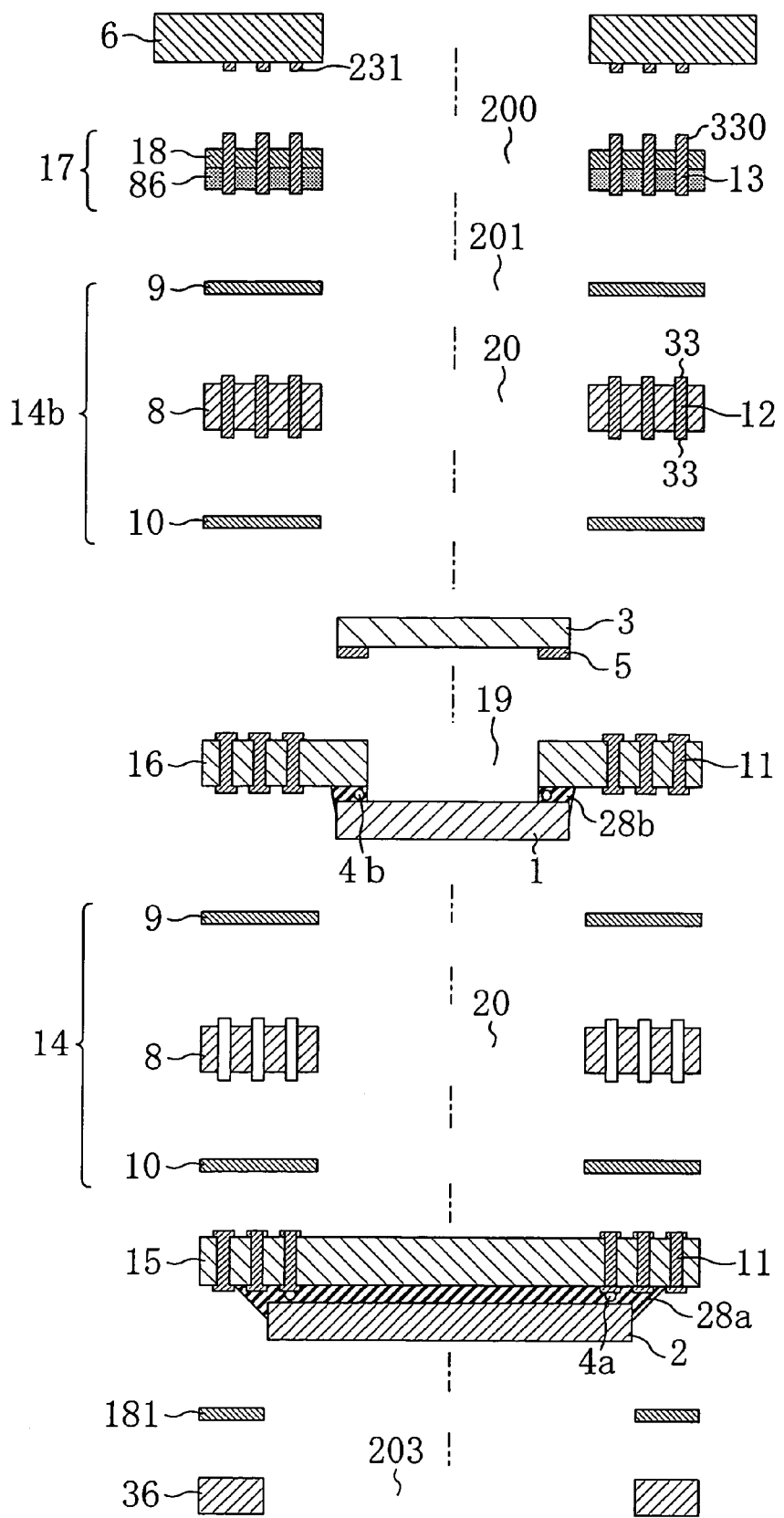
FIG. 21 is a cross-sectional view illustrating components of the imaging module of the sixth embodiment in a disassembled state.

FIG. 21 is a cross-sectional view illustrating respective components of the imaging module of this embodiment in a disassembled state. As illustrated in FIG. 21, a adhesive layer 181, a first resin board 15 on which a semiconductor control chip 2 is mounted, a first sheet member 14*a*, a second resin board 16 on which an imaging semiconductor chip 1 is mounted, a second sheet member 14*b*, a parallel-plane member 17 including an adhesive layer 18 at its upper surface and a printed circuit board 6 are stacked in this order over a rigid plate 36. The stacking direction of the components, alignment targets for the components, and an alignment method are the same as those in the first through third embodiments, and thus description thereof will be omitted.

In this manner, the components are stacked and brought into close contact with each other, and then heat and pressure are applied to the upper surface of the printed circuit board 6 at the top and the lower surface of the first resin board 15 at the bottom, thereby bonding the stacked components together. The first resin board 15 and the second resin board 16 are bonded together, and connection lands 23, 230 and 231 are brought into mechanical contact with projections 33, 330 of buried conductors in sheet members 14 to have electrical connection. In this manner, a multilevel structure according to this embodiment is obtained.

In the multilevel structure, an optical member 3 such as a cover glass, a transparent resin or an optical filter, having a thickness of 300 μm and larger than an imaging opening 19 when viewed from above, is bonded to the upper surface of the second resin board 16 on which the imaging semiconductor chip 1 is mounted to cover the imaging opening 19, using an optical-member adhesive 5, thereby obtaining an imaging module 530 of this embodiment.

Figure 22:
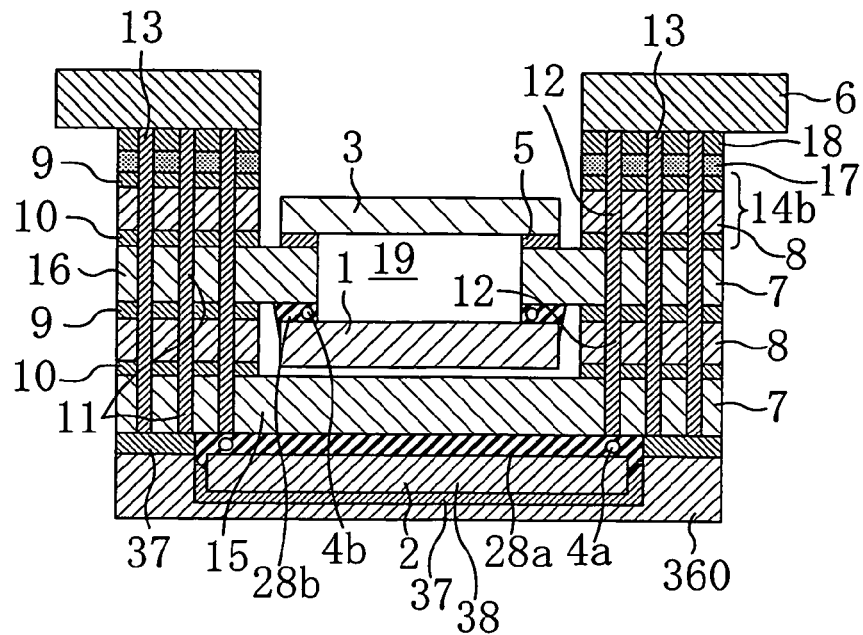
FIG. 22 is a cross-sectional view illustrating a modified example of the imaging module of the sixth embodiment.

FIG. 22 is a cross-sectional view illustrating a modified example of the imaging module 530 of this embodiment. In the modified example illustrated in FIG. 22, the shape of the rigid plate is different from that in the imaging module 530 of this embodiment. Specifically, in an imaging module 540 according to this modified example, instead of the rigid plate 36 having the opening, a rigid plate 360 having, in its center portion, a cavity 38 in which the semiconductor control chip 2 can be housed and has the same size as that of the first resin board 15 when viewed from above is provided. A gap formed between the cavity 38 of the rigid plate 360 and the semiconductor control chip 2 is filled with an adhesive 37, and the upper surface of the rigid plate 360 and the lower surface of the first resin board 15 are bonded together with the same adhesive 37.

In this case, at least a region of the rigid plate 360 to be bonded to the first resin board 15 has insulating properties. As a material for the rigid plate 360, a material having the property of canceling a warp occurring in the imaging module 540 during heating and pressurization is selected. As a material for the rigid plate 360, a material which is susceptible to heat dissipation and less susceptible to oxidation, e.g., a vitreous material such as ceramic, may be used.

EMBODIMENT 7

Hereinafter, an imaging module 550 according to a seventh embodiment of the present invention will be described.

Figure 23:
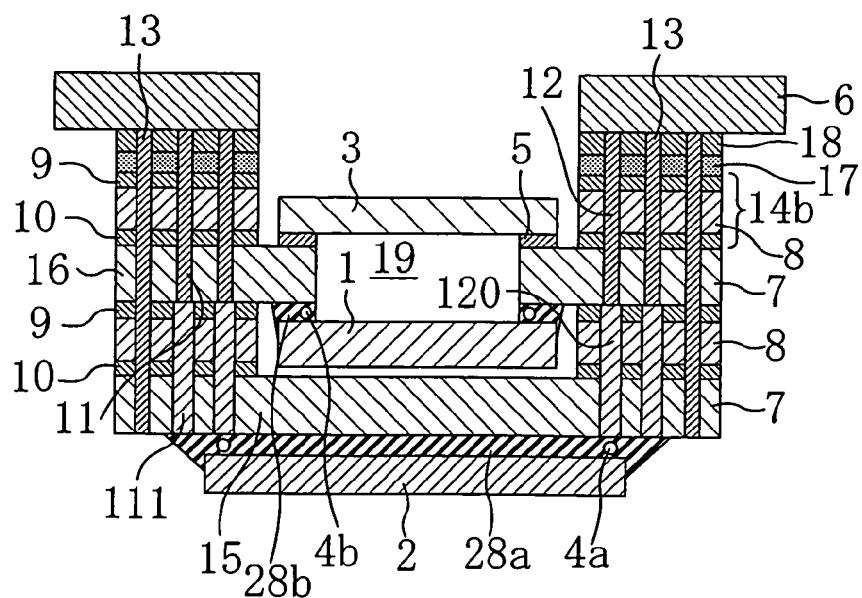
FIG. 23 is a cross-sectional view illustrating an imaging module of a seventh embodiment of the present invention.

FIG. 23 is a cross-sectional view illustrating a configuration of an imaging module according to this embodiment. In the imaging module of this embodiment, part of first buried conductors buried in a first resin board 15 at the bottom and part of second buried conductors buried in a first sheet member 14*a* serve as a conductive path electrically connecting devices on an imaging semiconductor chip 1 to a semiconductor control chip 2. As shown in FIG. 23, the imaging module 550 of this embodiment is different from the imaging module 500 of the third embodiment in that the diameter of first buried conductors 111 and second buried conductors 120 forming conductive paths between the two chips is larger than that of first buried conductors 11 buried in a second resin board 16 and second buried conductors 12 buried in a second sheet member 14b. The diameter of the first buried conductors 111 is larger than that of the other first buried conductors in the first resin board 15 not forming the conductive paths between the chips. The size of the second buried conductors 120 is larger than that of the other second buried conductors in the first sheet member 14a not forming the conductive paths between the chips.

With this configuration, the cross-sectional areas of the connection paths between the control devices on the semiconductor control chip 2 and the devices on the imaging semiconductor chip 1 are made uniform. Even if connection between connection bumps and buried conductors are insufficient after heating and pressurization in fabrication, a signal path between the chips is secured. Accordingly, reliability of operation of the imaging module 550 of this embodiment is higher than that of a conventional module.

EMBODIMENT 8

Figure 24A:
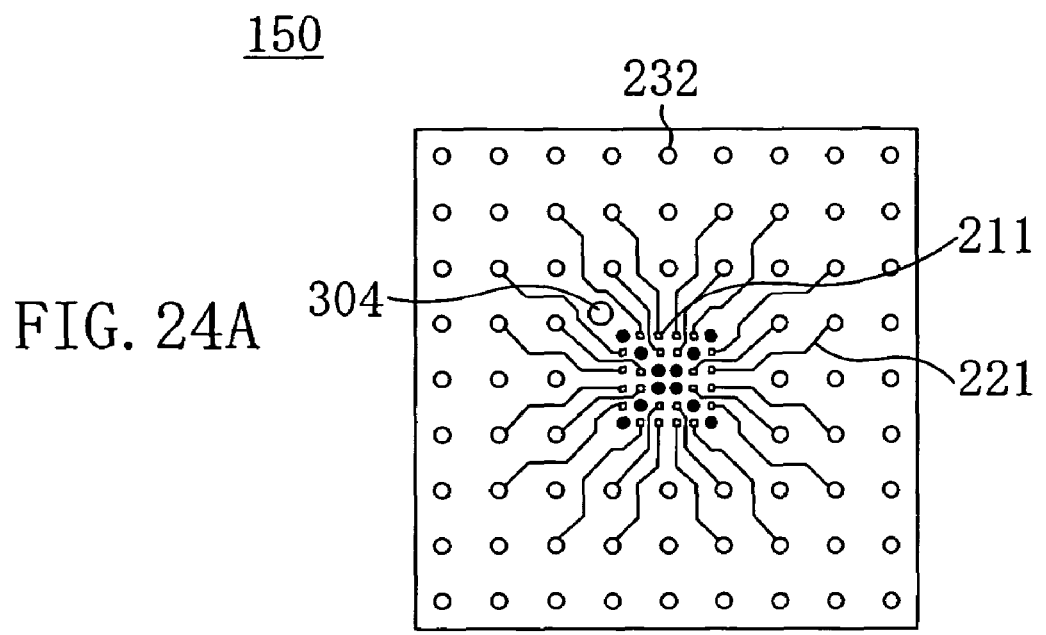
FIG. 24A is a plan view illustrating the lower surface of a first resin board in an imaging module according to an eighth embodiment of the present invention.
Figure 24B:
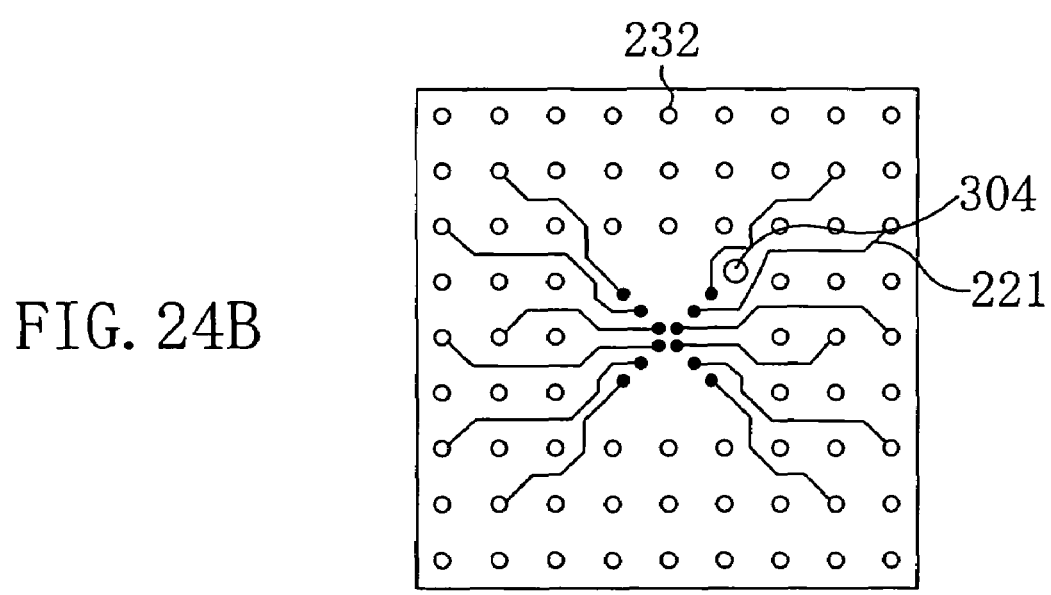
FIG. 24B is a plan view illustrating the upper surface of the first resin board.

FIG. 24A is a plan view illustrating the lower surface of a first resin board in an imaging module according to an eighth embodiment of the present invention. FIG. 24B is a plan view illustrating the upper surface of the first resin board.

As illustrated in FIG. 24A, the multilevel imaging module of this embodiment is characterized in that connection terminals 211 formed on the lower surface of the first resin board 150 are collectively formed on a center region of the first resin board 150. In this embodiment, the center region of the first resin board 150 is a region on which a semiconductor control chip is mounted.

In this arrangement, wires 221 connecting the connection terminals 211 and connection lands 232 differ from those on the first resin board 15 used in the imaging module 500 of the third embodiment. Specifically, as illustrated in FIGS. 24A and 24B, in the imaging module of this embodiment, wires 221 are formed on both upper and lower surfaces of the first resin board 150. This allows the connection terminals 211 to be arranged at fine pitch and the wires 221 to be arranged at a relatively wide pitch.

FIG. 25A is a plan view illustrating a semiconductor control chip 600 mounted on the first resin board 150. FIG. 25B is a cross-sectional view of the semiconductor control chip 600 taken along the line XXVb-XXVb in FIG. 25A. Electrode bumps 42 are collectively arranged in a center portion of the semiconductor control chip 600 according to the arrangement of the connection terminals 211. Auxiliary projections 34, serving as a pair, are provided at both ends of the semiconductor control chip 600 in the length direction. Two or more auxiliary projections 34 may be provided in the outer periphery of the semiconductor control chip 600. The height of the auxiliary projections 34 is preferably about the same as that of the electrode bumps 42.

FIG. 26 is a cross-sectional view showing a configuration in which the semiconductor control chip 600 shown in FIG. 25 is mounted on the first resin board 150 shown in FIGS. 24A and 24B. A method for fabricating an imaging module of this embodiment will be briefly described with reference to FIG. 26.

First, in forming an imaging module, the semiconductor control chip 600 is mounted on the first resin board 150 and the electrode bumps 42 and the connection terminals 211 are bonded together with solder or a conductive adhesive. Since the auxiliary projections 34 are formed on the back surface of the semiconductor control chip 600, the semiconductor control chip 600 does not tilt during this alignment, and the first resin board 150 and the semiconductor control chip 600 are bonded in parallel with each other. In addition, the auxiliary projections 34 prevent a crack, for example, from occurring even when a load is applied to the semiconductor control chip 600.

After the semiconductor control chip 600 is mounted on the first resin board 150, a gap between the first resin board 150 and the semiconductor control chip 600 is filled with a liquid resin 320 containing an inorganic filler. If through holes 304 are previously formed in a region of the first resin board 150 near the connection terminals 211, the liquid resin 320 is easily injected from the side toward the lower surface (the surface facing the surface on which the chip is mounted) of the first resin board 150 after the semiconductor control chip 600 has been mounted. If dummy electrodes 39 are provided on the upper surface of the first resin board 150 at positions corresponding to the auxiliary projections 34, the semiconductor control chip 600 and the first resin board 150 are kept in parallel with each other with higher accuracy. Even in a case in which such auxiliary projections are provided on the principal surface of the imaging semiconductor chip 1, the same advantages are obtained.

Sealing with the liquid resin 320 is not necessarily performed and may be omitted. Alternatively, a configuration in which a connection portion between the connection terminals 211 and the electrode bumps 42 is sealed with the liquid resin 320 and a peripheral portion in the principal surface of the semiconductor control chip 600 including the auxiliary projections 34 is sealed using a more flexible resin material may be adopted. The use of a flexible material allows a stress caused by a difference in linear expansion coefficient to be absorbed.

The first resin board 150 includes: a first resin base 7; connection terminals 211 formed on one surface of the first resin base 7; connection lands 232 formed on both surfaces of the first resin base 7; wires 221 for connecting the connection terminals 211 and the connection lands 232 together; dummy electrodes 39 to be in contact with auxiliary projections 34; first buried conductors 112 penetrating through the first resin base 7 and having both ends project from the first resin base 7.

The first resin board 150, a second resin board 16, a parallel-plane member 17, a printed circuit board 6 and a sheet members 14 having shapes associated with these components are stacked, and then are united by application of heat and pressure, thereby completing a multilevel imaging module of this embodiment.

In the imaging module of this embodiment thus formed, the semiconductor control chip 600 is in contact with the first resin board 150 in a small area, and the connection terminals 211 and the electrode bumps 42 are collectively arranged, so that occurrence of a warp in a bimetal structure caused by the difference in linear expansion coefficient between the chip and the board is effectively suppressed, and disconnection at the connection terminals 211 is also suppressed.

EMBODIMENT 9

Figure 27:
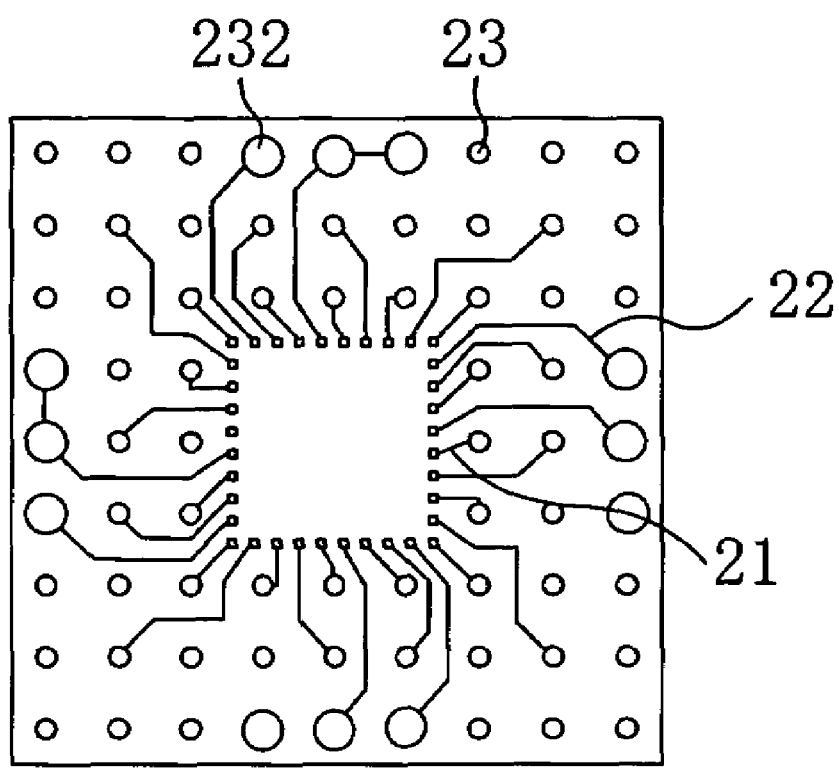
FIG. 27 is a plan view illustrating a first resin board used in an imaging module according to a ninth embodiment of the present invention.

FIG. 27 is a plan view illustrating a first resin board 151 used in an imaging module according to a ninth embodiment of the present invention.

The imaging module of this embodiment is characterized in that the diameter of first buried conductors (not shown) to be connected to predetermined ones of electrode bumps formed on the principal surface of a semiconductor control chip 2 is larger than that of the other first buried conductors. The predetermined electrode bumps are, for example, input/output terminals at which high-speed operation of, for example, the semiconductor control chip 2 and an imaging semiconductor chip 1 is needed and a power supply terminal. Accordingly, the diameter of connection lands 233 formed around the first buried conductors having a large diameter is also larger than those in the imaging modules of the other embodiments.

Though not shown, the diameter of associated second buried conductors in sheet members is also large. The first resin board 151, the second resin board and the sheet members with the foregoing structure are stacked in the same manner as in the method of the third embodiment, and are subjected to application of heat and pressure, thereby obtaining an imaging module (not shown) of this embodiment. With respect to third buried conductors in a parallel-plane member, the diameter of third buried conductors electrically connected to the predetermined electrode bumps may be larger than that of the other third buried conductors.

In the imaging module of this embodiment, if signals transmitted through input/output terminals of the semiconductor control chip 2 include a signal requiring a transmission path for transmitting a signal for high-speed operation or a signal requiring a transmission path for transmitting an analog signal, electric signals are transmitted with stability since the first and second buried conductors forming part of transmission paths have large diameters. In addition, a resistance component on the transmission path is reduced, and heat generation in the module by Joule heat is suppressed.

In most of the examples in the first through seventh embodiments, glass epoxy resin, for example, is used as a material of the first resin board 151. However, the present invention is not limited to this. For example, a mixture containing 70 wt % to 95 wt % of an inorganic filler and a thermosetting resin may be used as the first resin bases of the first resin board 151 and the second resin board or the second resin bases of the sheet members. The use of such a material makes the thermal expansion coefficient approach that of the semiconductor chip, and is effective for suppressing a warp.

In the imaging modules of the first through seventh embodiments, the semiconductor control chip is flip-chip bonded to the first resin board, but the present invention is not limited to this. For example, wire bonding may be adopted. In such a case, a semiconductor-device mount portion including wire leads may be protected with a resin after assembly.

As described in the foregoing embodiments, in an imaging module according to the present invention, optical accuracy is enhanced and occurrence of a warp is suppressed, so that excellent bonding to an optical unit and a mother board is achieved with high yield. Accordingly, the imaging module of the present invention is useful as a part of a monitor for a cellular phone or a digital camera.

What is claimed is:

1. An imaging module, comprising:
   a first resin board;
   a second resin board placed on or above the first resin board and having a first opening;
   a first electrically-conductive member electrically connecting the first resin board and the second resin board to each other;
   a printed circuit board placed on or above the second resin board and having a light-receiving opening;
   a second electrically-conductive member electrically connecting the second resin board and the printed circuit board to each other;
   an imaging semiconductor chip having a principal surface on which an imaging sensor for receiving light from outside the module is provided, the imaging semiconductor chip being mounted on a lower surface of the second board to cover the first opening with the principal surface of the imaging semiconductor chip facing upward;
   an optical member overlapping the imaging semiconductor chip when viewed from above and placed on an upper surface of the second resin board to cover the first opening, the optical member being smaller than the light-receiving opening when viewed from above;
   a semiconductor control chip having a principal surface on which a control device for controlling operation of the imaging sensor is provided;
   a parallel-plane member located between the second resin board and the printed circuit board, having a second opening surrounding the optical member. and including: a first resin base having a first through hole and having a uniform thickness; an adhesive layer formed on an upper surface of the first resin base; and a third electrically-conductive member buried in the first through hole and in the adhesive layer;
   a first sheet member located between the first resin board and the second resin board. having a third opening formed so as to accommodate the semiconductor control chip therein, and including a second resin base having a second through hole, first adhesive members provided on upper and lower surfaces of the second resin base and a first electrically-conductive member buried in the second through hole and in the first adhesive members: and
   a second sheet member located between the second resin board and the parallel-plane member, having a fourth opening formed so as to accommodate the optical member therein, and including a third resin base having a third through hole, second adhesive members provided on upper and lower surfaces of the third resin base, and a fourth electrically-conductive member buried in the third through hole and in the second adhesive members.
   wherein the third electrically-conductive member is at least a part of the second electrically-conductive member, and
   the fourth electrically-conductive member is at least part of the second electrically-conductive member.

2. The imaging module of claim 1, wherein the second resin base has a thickness larger than that of the semiconductor control chip.

3. The imaging module of claim 1, wherein the first electrically-conductive member has both ends project from the second resin base,
   the fourth electrically-conductive member has both ends project from the third resin base, and
   the third electrically-conductive member has an upper end project from the upper surface of the first resin base.

4. The imaging module of claim 1, wherein the imaging semiconductor chip mounted on the lower surface of the second resin board is separated from the first sheet member and the first resin board, and
   side and back surfaces of the imaging semiconductor chip are covered with a material forming the first adhesive member.

5. The imaging module of claim 1, wherein the first sheet member is provided with a plurality of said first electrically-conductive members, the first resin board includes a plurality of first buried conductors connected to the respective first electrically-conductive members, at least one of the first electrically-conductive members and at least one of the first buried conductors form a conductive path electrically connecting the imaging sensor and the control device to each other, and each of the first electrically-conductive member and the first buried conductor forming the conductive path has a diameter larger than that of each of the other first electrically- conductive members and the other buried conductors.

6. The imaging module of claim 1, wherein the semiconductor control chip further includes a plurality of first electrode bumps provided on the principal surface thereof and connected to the control device, the imaging semiconductor chip further includes a plurality of second electrode bumps placed on the principal surface thereof and connected to the imaging sensor, the first sheet member includes a plurality of said first electrically-conductive members, the first resin board includes a plurality of first buried conductors connected to the respective first electrically-conductive members, part of the first buried conductors is connected to the first electrode bumps or the second electrode bumps, the parallel-plane member includes a plurality of said third electrically-conductive members, the second resin board includes a plurality of second buried conductors connected to the respective third electrically-conductive members, and part of the second buried conductors is connected to the imaging sensor or the control device, and each of the first electrically-conductive members or the third electrically-conductive members connected to predetermined ones of the first electrode bumps or predetermined ones of the second electrode bumps has a diameter larger than that of each of the other first electrically-conductive members and the other third electrically-conductive members.

7. The imaging module of claim 1 wherein the first resin base forming the parallel-plane member is made of a material having a rigidity higher than that of the first resin board.

8. The imaging module of claim 1, wherein a plurality of adhensive layers are formed on upper and lower surfaces of the first resin base.

9. The imaging module of claim 1, wherein the semiconductor control chip includes an electrode bump provided on a center region of the principal surface thereof and connected to the control device, and the first resin board includes a connection tenninal provided on a lower surface thereof and connected to the electrode bump.

10. The imaging module of claim 1, wherein the optical member has an upper surface at a level higher than an upper surface of the printed circuit board.

11. The imaging module of claim 10, wherein a mechanical part capable of being electrically controlled is incorporated in the optical member.

12. The imaging module of claim 10, wherein the optical member includes a combination of a plurality of lenses.

13. The imaging module of claim 1, wherein the imaging sensor includes a light-emitting device and a light-receiving device.

\* \* \* \* \*

UNITED STATES PATENT AND TRADEMARK OFFICE
CERTIFICATE OF CORRECTION

| | | |
|---|---|---|
| PATENT NO. | : 7,443,028 B2 | Page 1 of 1 |
| APPLICATION NO. | : 11/369818 | |
| DATED | : October 28, 2008 | |
| INVENTOR(S) | : Motoaki Satou et al. | |

It is certified that error appears in the above-identified patent and that said Letters Patent is hereby corrected as shown below:

In column 30, line 28, change "second resin board." to -- second resin board, --

In column 30, lines 29-30, change "the semiconductor control chip" to -- the imaging semiconductor chip --

Signed and Sealed this

Fourteenth Day of December, 2010

David J. Kappos
*Director of the United States Patent and Trademark Office*